US007057222B2

(12) United States Patent
Jeong

(10) Patent No.: US 7,057,222 B2
(45) Date of Patent: Jun. 6, 2006

(54) MAGNETIC MEMORIES WITH BIT LINES AND DIGIT LINES THAT INTERSECT AT OBLIQUE ANGLES AND FABRICATION METHODS THEREOF

(75) Inventor: Won-Cheol Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 86 days.

(21) Appl. No.: 10/687,134

(22) Filed: Oct. 16, 2003

(65) Prior Publication Data

US 2004/0084702 A1    May 6, 2004

(30) Foreign Application Priority Data

Nov. 1, 2002    (KR)    ........................ 10-2002-0067349

(51) Int. Cl.
*H01L 29/76* (2006.01)

(52) U.S. Cl. ............................ 257/295; 257/3; 257/9; 257/53; 257/414; 257/421; 365/210

(58) Field of Classification Search ................ 257/3, 257/9, 53, 414, 421; 365/210
See application file for complete search history.

(56) References Cited

U.S. PATENT DOCUMENTS

| 6,518,588 B1 * | 2/2003 | Parkin et al. ................... 257/3 |
| 6,697,294 B1 * | 2/2004 | Qi et al. ........................ 365/210 |
| 6,891,193 B1 * | 5/2005 | Schwarz ....................... 257/53 |

FOREIGN PATENT DOCUMENTS

| KR | 10-1999-0072262 | 9/1999 |
| WO | WO 02-07166 | 1/2002 |
| WO | WO 0207166 | 1/2002 |

OTHER PUBLICATIONS

Notice to File Response, Korean Application No. 10-2002-0067349, Oct. 27, 2004.
Notice to File a Response/Amendent to the Examination Report for Korean application No. 2002-67349 mailed on Apr. 27, 2005.

* cited by examiner

*Primary Examiner*—Mai-Huong Tran
(74) *Attorney, Agent, or Firm*—Myers Bigel Sibley & Sajovec, PA

(57) ABSTRACT

A magnetic memory includes digit lines, bit lines, and magnetic tunnel junctions (MTJs) that are between the bits lines and the digit lines. The digit lines intersect the bit lines at an oblique angle. The digit lines may intersect the bit lines at an oblique angle of from 15° to 75°.

17 Claims, 23 Drawing Sheets

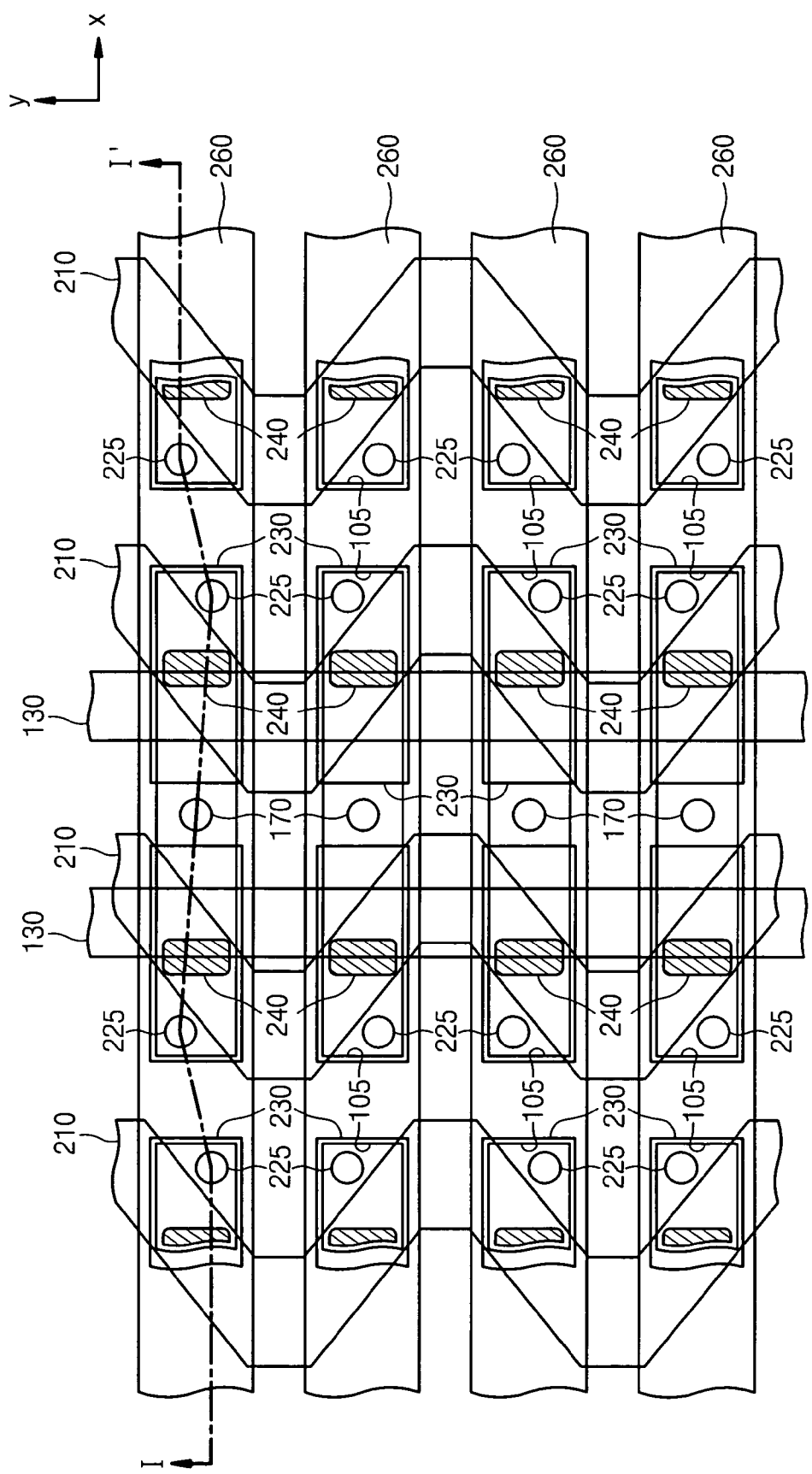

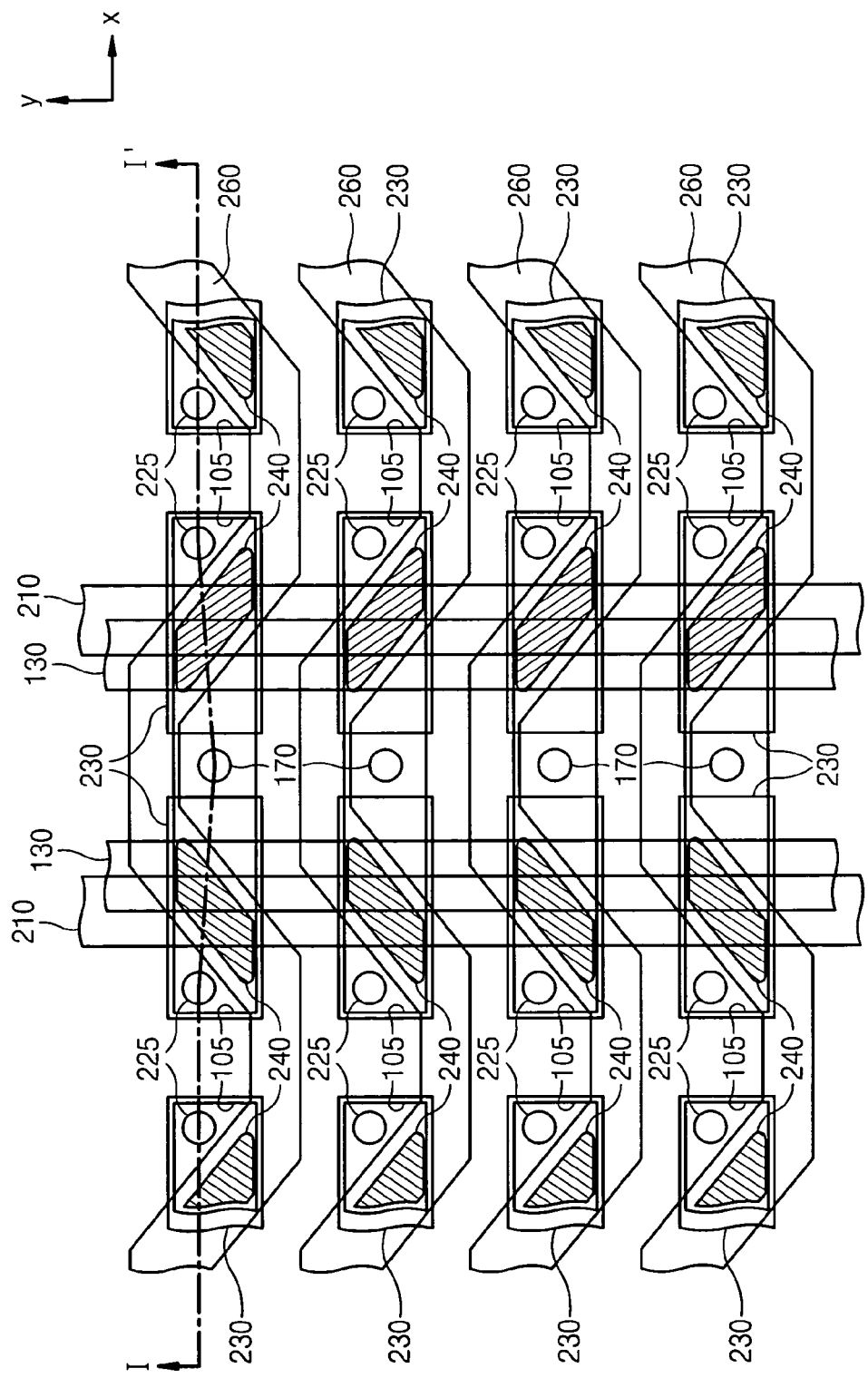

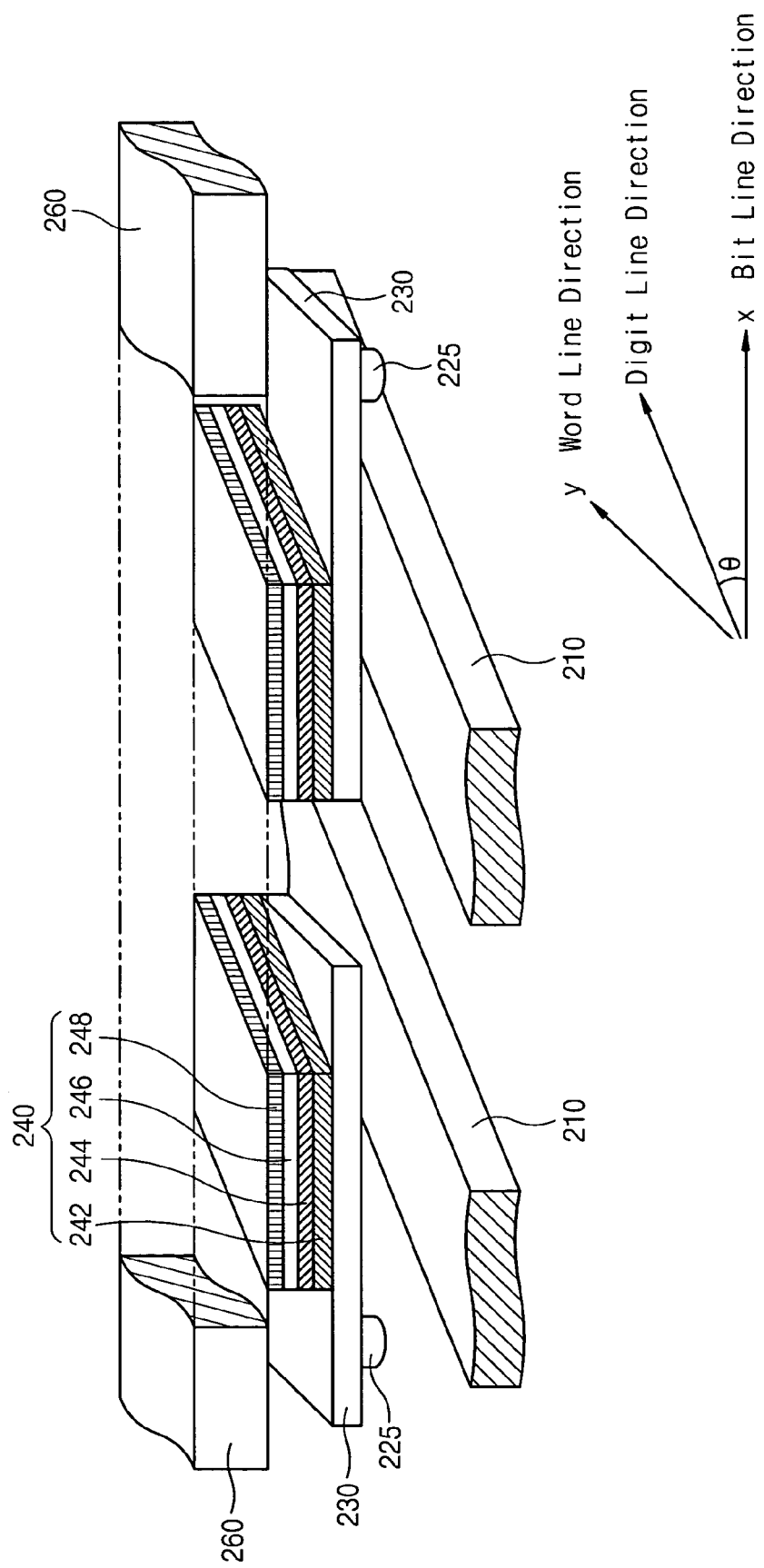

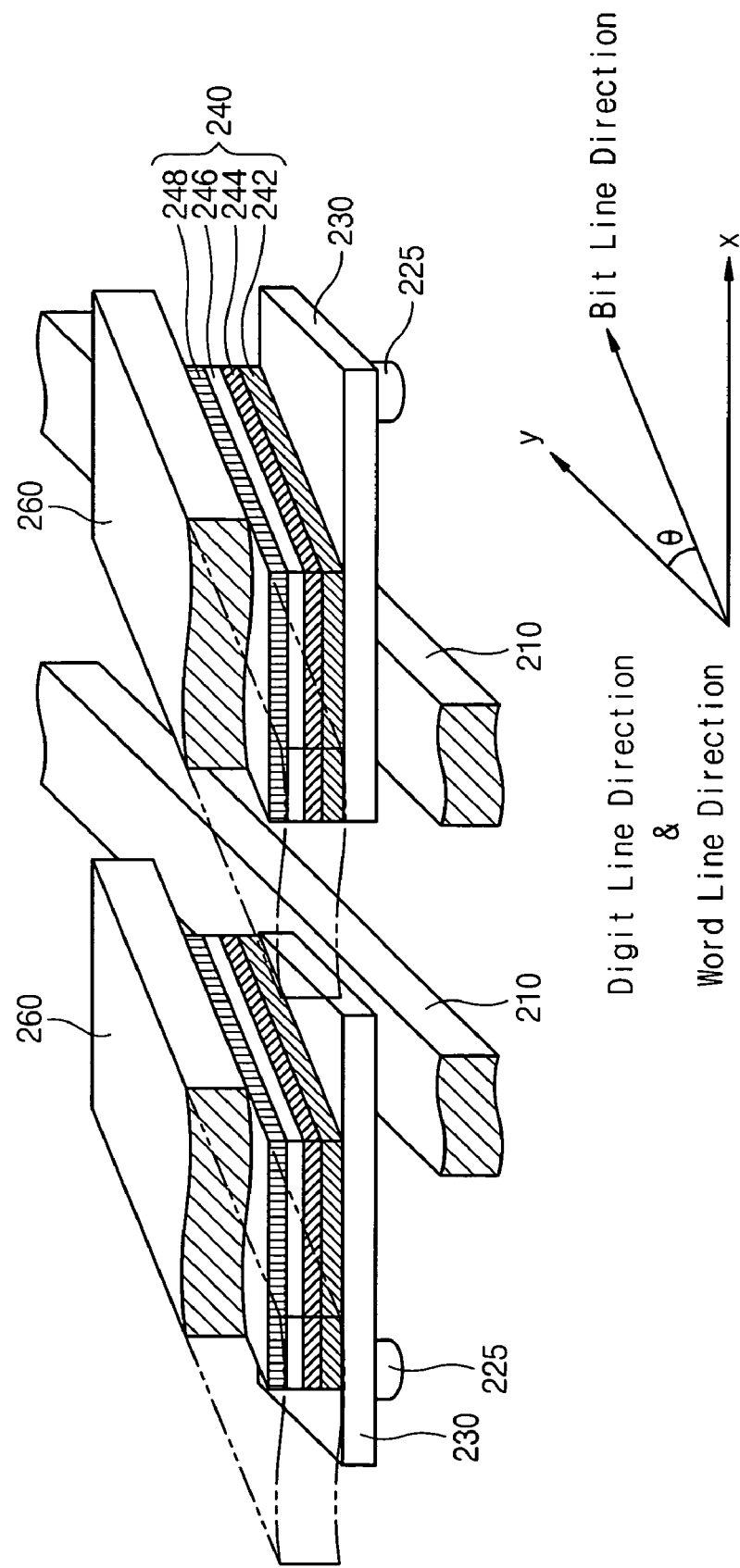

US 7,057,222 B2

MAGNETIC MEMORIES WITH BIT LINES AND DIGIT LINES THAT INTERSECT AT OBLIQUE ANGLES AND FABRICATION METHODS THEREOF

RELATED APPLICATION

This application claims the benefit of Korean Patent Application No. 10-2002-0067349, filed Nov. 1, 2002, the disclosure of which is hereby incorporated herein by reference in its entirety as if set forth fully herein.

FIELD OF THE INVENTION

The present invention relates to semiconductor devices and related fabrication methods, and more particularly, to magnetic random access memories (MRAMs) that have magnetic tunnel junctions (MTJs) and fabrication methods thereof.

BACKGROUND OF THE INVENTION

Some types of semiconductor memory devices are SRAM (Static Random Access Memory), DRAM (Dynamic Random Access Memory), flash memory, and ferromagnetic RAM. These memory devices can have significantly different operational properties, such as those shown below in Table 1, and accordingly may be appropriate for use in some electronic devices, but not others.

may be smaller than the unit cell area of a DRAM. Accordingly, NAND flash memory may have a higher integration density than DRAM devices. However, NAND flash memory may need a high driving voltage, such as, for example from 5 to 12 volts in a write mode, and may have a low erase speed. Also, integration density of the NAND flash memory may be reduced by the use of a pumping circuit to elevate the driving voltage. Flash memory may also provide a limited number of rewritable operations, such as, for example $10^5$ to $10^6$ rewrites.

A ferroelectric memory may use, for example, one transistor and one capacitor per unit cell, similar to DRAMs. A ferroelectric memory can be made non-volatile by using a ferroelectric material in the capacitor. Read operations may have a destructive affect on information in memory cells, so that a rewrite operation may be needed after a read operations. Ferroelectric memories may also provide a limited number of write operations, and may provide relatively average memory access speeds. Ferroelectric memories can be difficult to manufacture because of, for example, reactivity of the ferroelectric materials with hydrogen, high temperatures that may be used for annealing processes, and scalability and cell voltage issues.

Magnetic RAM or Magnetoresistive RAM (MRAM) can be used to provide non-volatile memory that may not be write cycle limited, may allow high integration density, may provide fast memory access operations, and may use a lower voltage relative to ferroelectric memories.

TABLE 1

|  | SRAM | DRAM | FLASH | FeRAM | MRAM |
| --- | --- | --- | --- | --- | --- |
| Read | High speed | Half speed | High speed | Half speed | Half ~ High speed |
| Write | High speed | Half speed | Low speed | Half speed | Half ~ High speed |
| Non-volatility | Not exist | Not exist | Exist | Half | Exist |
| Refresh | Not Need | Need | Not Need | Not Need | Not Need |
| Size of Unit Cell | Larger | Smaller | Smaller | Half | Smaller |
| Low Voltage for Operation | POSSIBLE | LIMITED | IMPOSSIBLE | LIMITED | POSSIBLE |

FIG. 1A is a circuit diagram of a unit memory cell of a prior art full CMOS SRAM, in which a P-channel MOSFET is used as a pull-up device. Such SRAM devices may provide high speed read and write operations and/or low power consumption. However, as shown in FIG. 1A, the unit cell has six transistors, which may limit the integration density of such unit cells.

FIG. 1B is a circuit diagram of a cell array of a prior art DRAM. The unit cell of the DRAM has one transistor and one capacitor, the DRAM may have a unit cell area of about $10F^2$, which can be much smaller than the unit cell area of the SRAM ("F" indicates a minimum feature size). Accordingly, the DRAM may have a higher unit cell integration density than the SRAM. In contrast to SRAMs, DRAMs may need a refresh operation every several milliseconds to prevent loss of information due to, for example, leakage of stored charge.

Some electronic devices need non-volatility memory in which stored information is maintained after power for the memory is removed. Flash memories and ferroelectric memories may be used to provide non-volatility memory in such electronic devices.

FIG. 1C is a circuit diagram of a cell array of a prior art NAND flash memory. Because the illustrated NAND flash memory does not include a cell capacitor and a contact in every unit cell, it may have a unit cell area of $4~8F^2$, which A prior art MRAM is hereafter described with reference to FIGS. 2 to 4. FIG. 2 is a plan view of a part of a cell array of a prior art MRAM. FIG. 3 is a sectional view taken along line I–I' of FIG. 2. FIG. 4 is a perspective view of a structure of a prior art MRAM with a Magnetic Tunnel Junction (MTJ).

Referring to FIGS. 2 to 4, a device isolation region 12 defines an active region 11 in a semiconductor substrate 10. A plurality of gate electrodes or word lines 15 intersect over the active regions 11 and the device isolation region 12. Each of the active regions 11 perpendicularly intersects over a pair of gate electrodes 15, so that if the active regions 11 are arranged in a row direction (X-axis direction), the gate electrodes 15 are arranged in a column direction (Y-axis direction). A common source region 16s is formed in the active region 11 between the gate electrodes 15, and the drain regions 16d are formed in the active regions 11 on both sides of the common source region 16s. A cell transistor of the MRAM is thereby arranged at an intersection point of the active region 11 and the gate electrode 15.

A whole surface of the resultant substrate including the cell transistor is covered with an interlayer insulating film 20. A plurality of digit lines 30 are parallel to the gate electrodes 15 in the interlayer insulating film 20. A plurality of bit lines 50 are formed parallel to the active region 11 to intersect over the gate electrode 15, on the interlayer insulating film 20 and over the digit lines 30. A magnetic tunnel junction (MTJ) 40 is formed between the bit line 50 and the digit line 30. A lower electrode 35 is between the MTJ 40 and the digit line 30 and extends to an upper portion of the drain region 16d. The MTJ 40 contacts a lower surface of the bit line 50 and an upper surface of the lower electrode 35. A vertical wiring 25 is formed in the interlayer insulating film 20 and electrically connects the drain region 16d to the lower electrode 35. The vertical wiring 25 can also include a plurality of plugs having a sequentially stacked structure. A source line 28 is connected to an upper surface of the common source region 16s via a source plug 26 that is connected therebetween.

The MTJ 40 may have a sequentially stacked structure of a pinning layer 42, a fixed layer 44, an insulating layer 46 and a free layer 48. The resistance of the MTJ 40 can substantially vary based on the relative magnetization directions of the fixed layer 44 and the free layer 48 (e.g., same or opposite magnetization directions). Consequently, resistivity of the MTJ 40 can be used to indicate information in a MRAM. Generally, the magnetization direction of the fixed layer 44 is not varied during a reading/writing operation. A multi-layered or single layered pinning layer 42 can fix the magnetization direction of the fixed layer 44. The magnetization direction of the free layer 48 can vary relative to the magnetization direction of the fixed layer 44. For example, the magnetization direction of the free layer 48 can be the same or reversed to that of the fixed layer 44.

Information may be read from a cell by selecting the corresponding word line 15 and bit line 50, and then measuring current flowing therethrough. Current magnitude may substantially vary depending on the relative magnetization directions of the fixed layer 44 and the free layer 48. The relative current magnitude can represent stored information (e.g., binary values). Information can be written to a cell by varying the magnetization direction of the free layer 48, such as by creating a magnetic field from the current flowing through the bit line 50 and the digit line 30.

SUMMARY OF THE INVENTION

According to some embodiments of the present invention, a magnetic memory includes digit lines, bit lines, and magnetic tunnel junctions (MTJs) between the bits lines and the digit lines. The digit lines intersect the bit lines at an oblique angle. In some further embodiments of the present invention, the digit lines intersect the bit lines at an oblique angle of from 15° to 75°. For example, as the oblique angle between the intersecting digit lines and the bit lines decreases from 75°, the magnetic field that is created by current in the digit lines and the bit lines may increase. Consequently, a MJT between a digit line and a bit line may be programmed using less current in the digit lines and/or the bit lines. Adjacent MJTs may also be subjected to less electromagnetic disturbance during programming of a MJT.

In yet some further embodiments of the present invention, the MJTs may be directly connected to the bit lines. The magnetic memory can include cell transistors that are arrayed along row and column directions. The cell transistors can include a gate electrode, a source regions, and a drain region. The gate electrode of the cell transistors may be connected to each other through word lines. The digit lines may be parallel to the word lines, and the bit lines may intersect the word lines at an oblique angle. The bit lines may zigzag to connect the drain regions of the cell transistors. The digit lines may intersect the cell transistors in a zigzag pattern. The MTJs may have a rectangular or parallelogram shape, and may have rounded corner portions.

BRIEF DESCRIPTION OF THE DRAWINGS

FIGS. 8A to 11A and FIGS. 8B to 11B are plan views of cell arrays of MRAMs according to other embodiments of the present invention.

FIG. 12 is a perspective view of a MRAM with a magnetic tunnel junction according to the first and third embodiments of the present invention.

FIG. 13 is a perspective view of a MRAM with a magnetic tunnel junction according to the second and fourth embodiments of the present invention.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will also be understood that the sizes and thickness of layers are not shown to scale, and in some instances they have been exaggerated for purposes of explanation.

According to various embodiments of the present invention, a unit cell of a Magnetic Random Access Memory (MRAM) includes a digit line, a bit line, and a magnetic tunnel junction that is interposed therebetween. MRAM cells can be arranged in two dimensions as well as in three dimensions. for example, more than one plane of MRAM cells may be provided in an MRAM. A MRAM cell may include a tunneling magneto-resistive (TMR) element on a semiconductor substrate with, or without, other transistors. A MRAM cell can be connected to other functional circuits, such as to transistors, through conductors formed by, for example, wire bonding, flip-chip bonding, and solder bump.

Figure 1A:
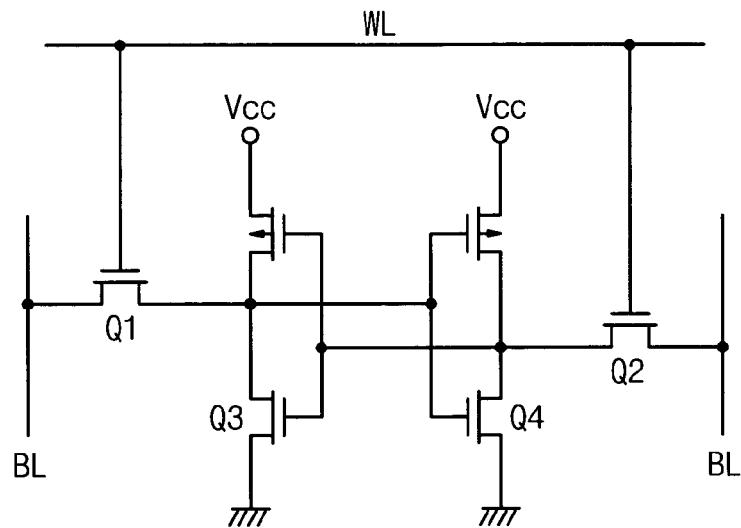
FIG. 1A is a circuit diagram of a unit cell of a prior art CMOS-type SRAM.
Figure 1B:
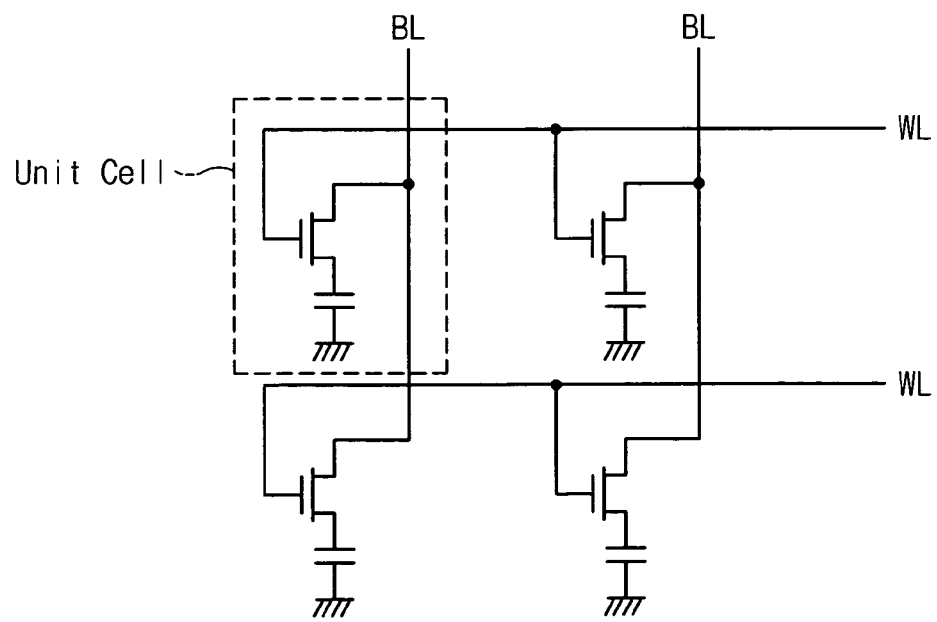
FIG. 1B is a circuit diagram of a cell array of a prior art DRAM.
Figure 1C:
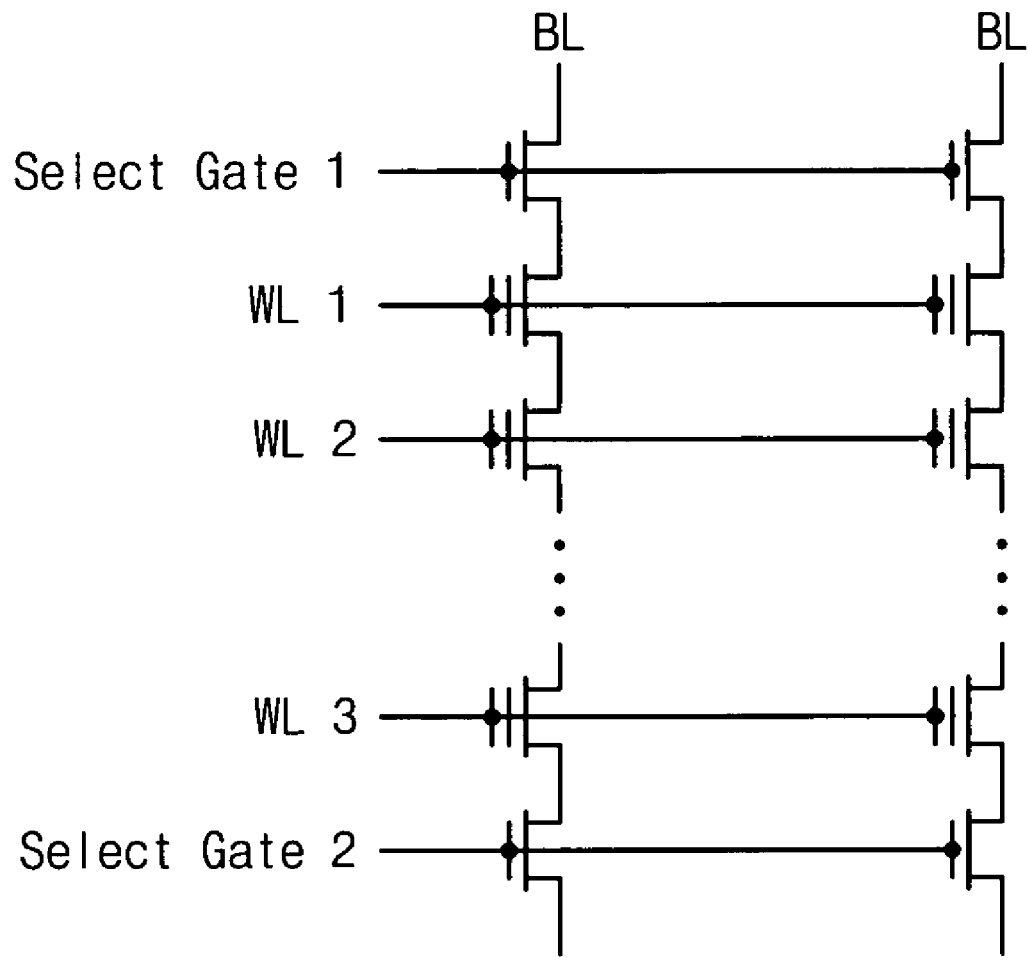
FIG. 1C is a circuit diagram of a cell array of a prior art NAND flash memory.
Figure 2:
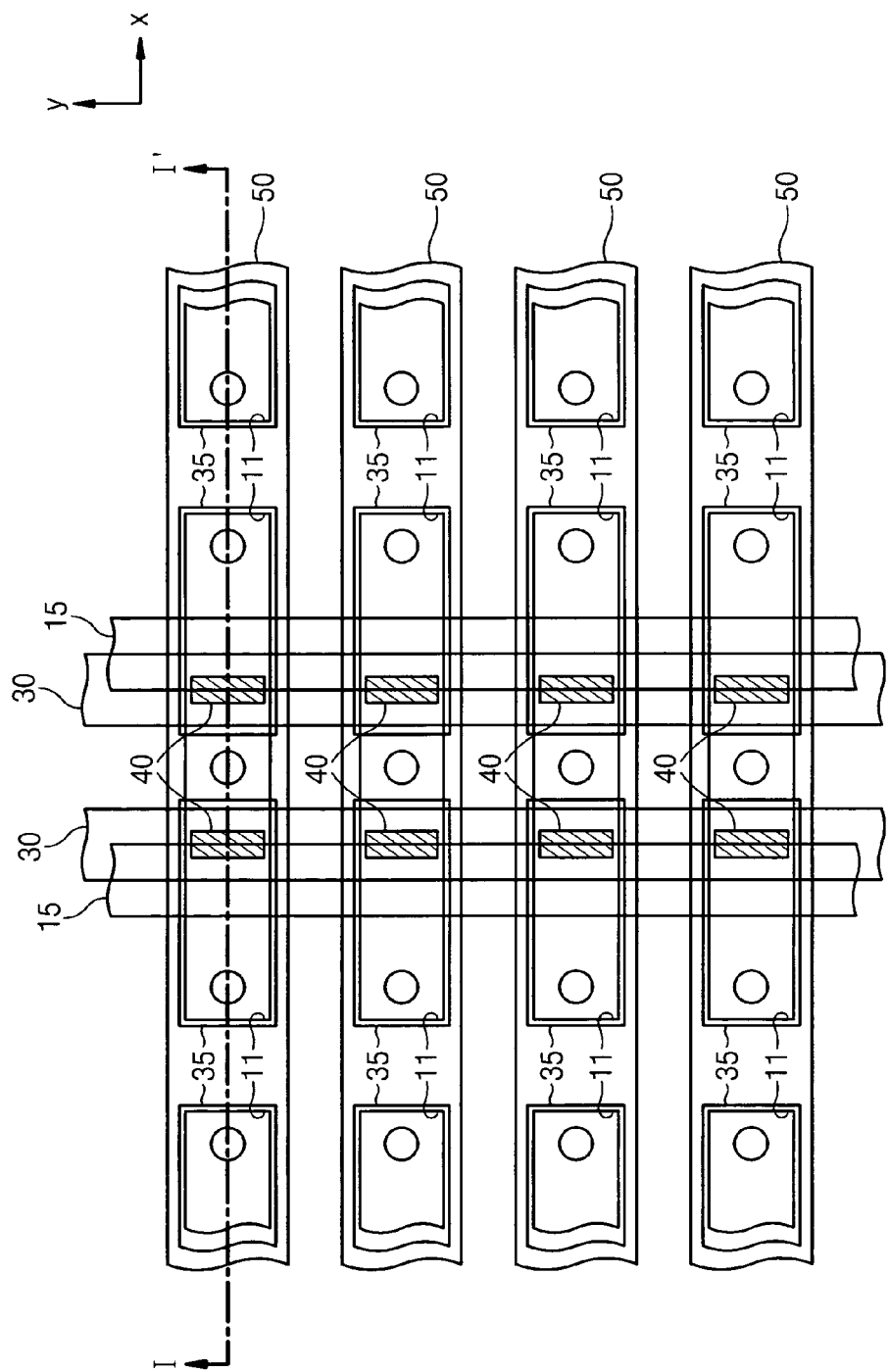
FIG. 2 is a plan view of a part of a cell array of a prior art magnetic random access memory (MRAM).
Figure 3:
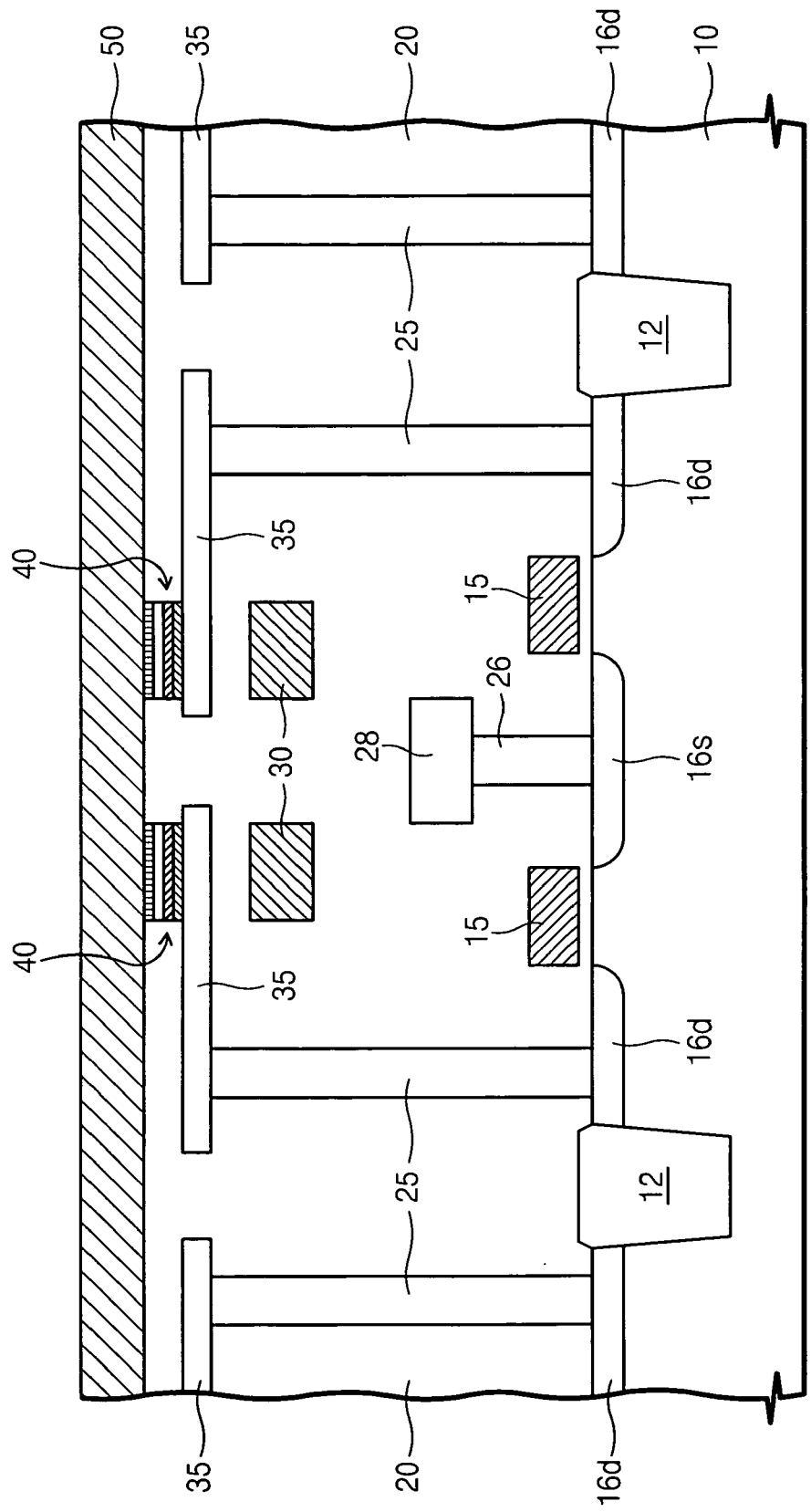
FIG. 3 is a cross-sectional view of a cell array of a prior art MRAM.
Figure 4:
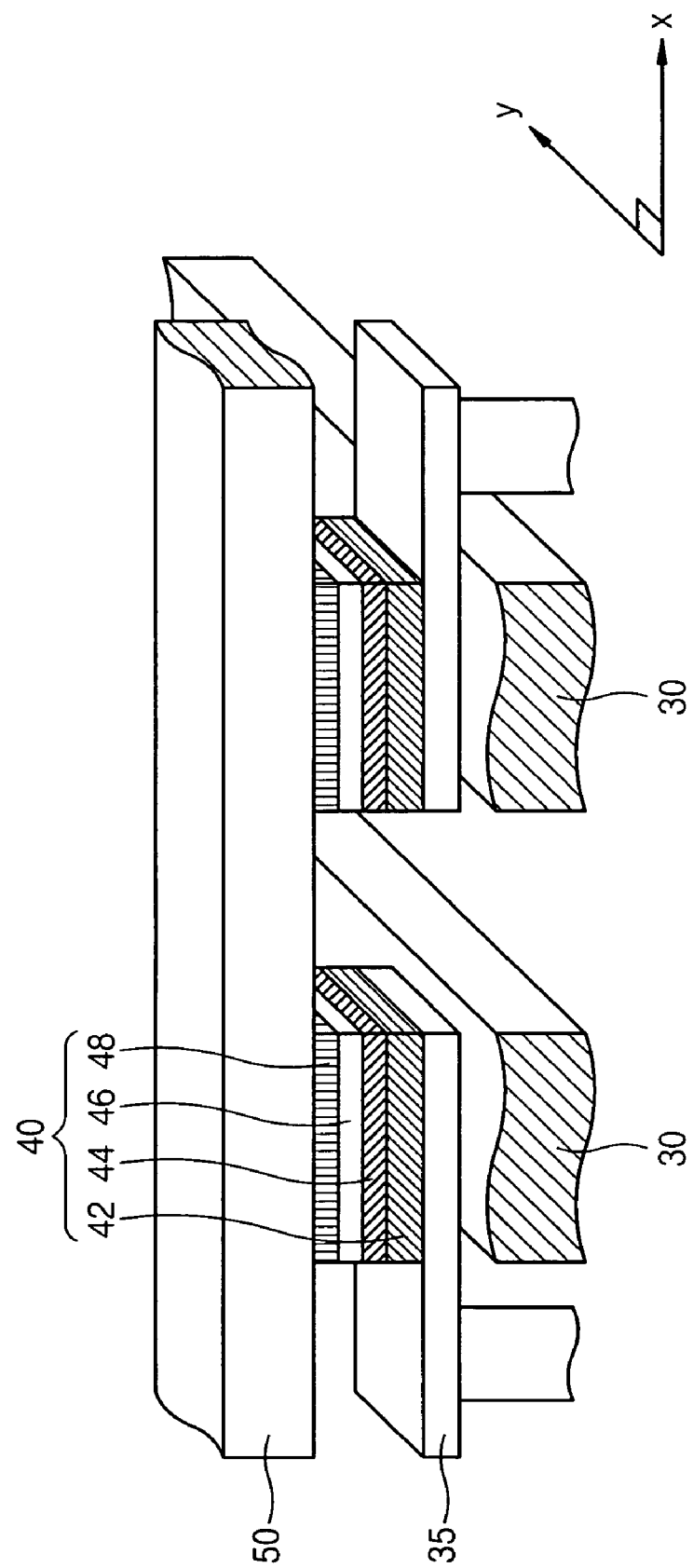
FIG. 4 is a perspective view of a prior art MRAM with Magnetic Tunnel Junctions (MTJs).
Figure 5:
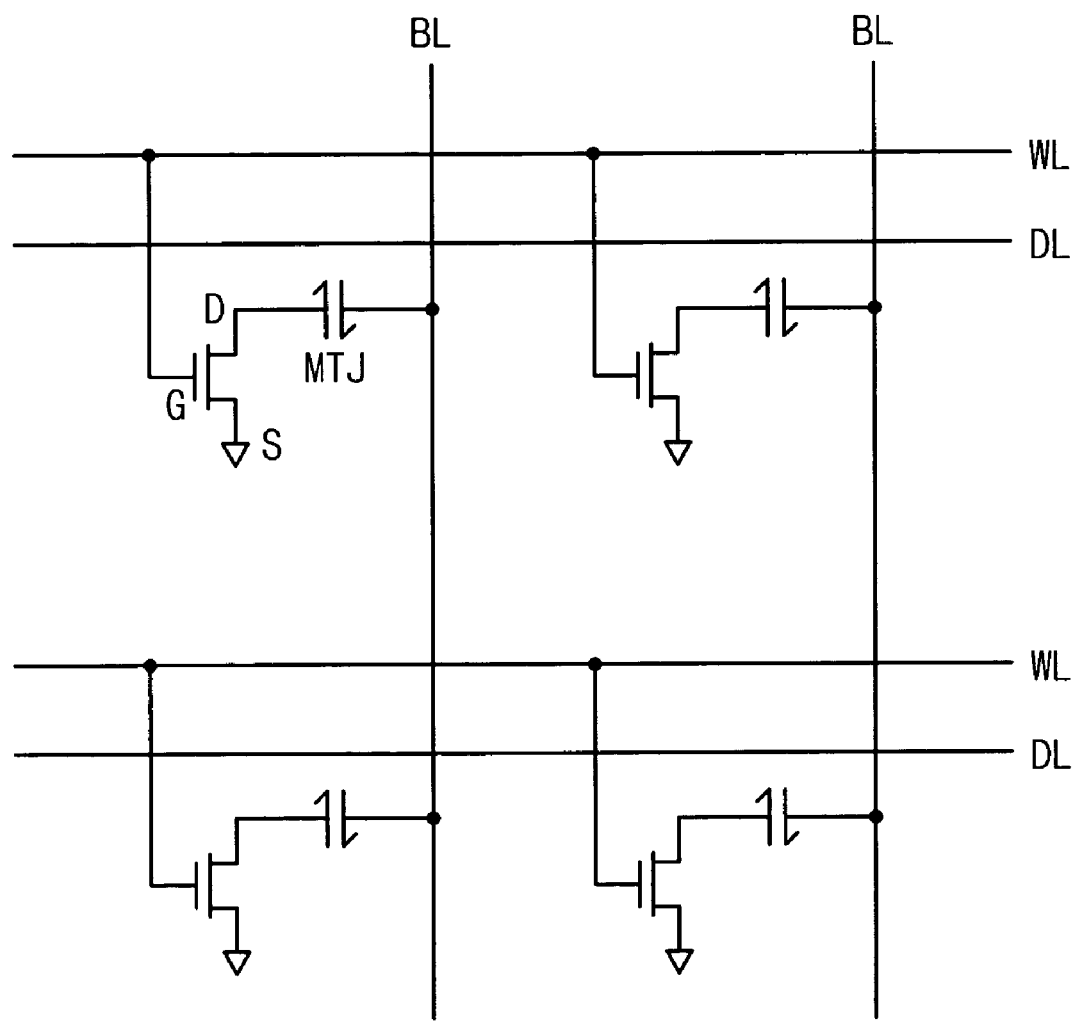
FIG. 5 is a circuit diagram of a cell array of an MRAM according to first and second embodiments of the present invention.

FIG. 5 is a circuit diagram of a cell array of an MRAM according to first and second embodiments of the present invention. Referring to FIG. 5, a plurality of cell transistors are arranged two-dimensionally in row and column directions. The cell transistors may be MOSFETs (Metal-Oxide-Semiconductor Field Effect Transistors) with a source region (S) and a drain region (D) on a semiconductor substrate, and may be connected to one another by a plurality of word lines (WL) and bit lines (BL). The word lines (WL) and the bit lines (BL) can be respectively arranged in the row and the column directions, and are respectively connected to gates (G) and drains (D) of the cell transistors. Magnetic tunnel junctions (MTJs) are between the bit lines (BL) and the cell transistors, and provide information storage in the MRAM.

A plurality of digit lines (DL) are arranged to intersect the cell transistors in a parallel direction to the word lines (WL). Thus, the word lines (WL) and the digit lines (DL) both intersect the bit lines (BL). The bit line (BL), the digit line (DL), and the word line (WL) may be used to select a particular cell transistor. The word line (WL) and the digit line (DL) select cell transistors that are arranged in the same direction (e.g., connect transistors in rows). The bit line (BL) connects cell transistors to one another in a perpendicular direction to the word line (WL) and the digit line (DL) (e.g., connect transistors in columns).

Figure 8B:
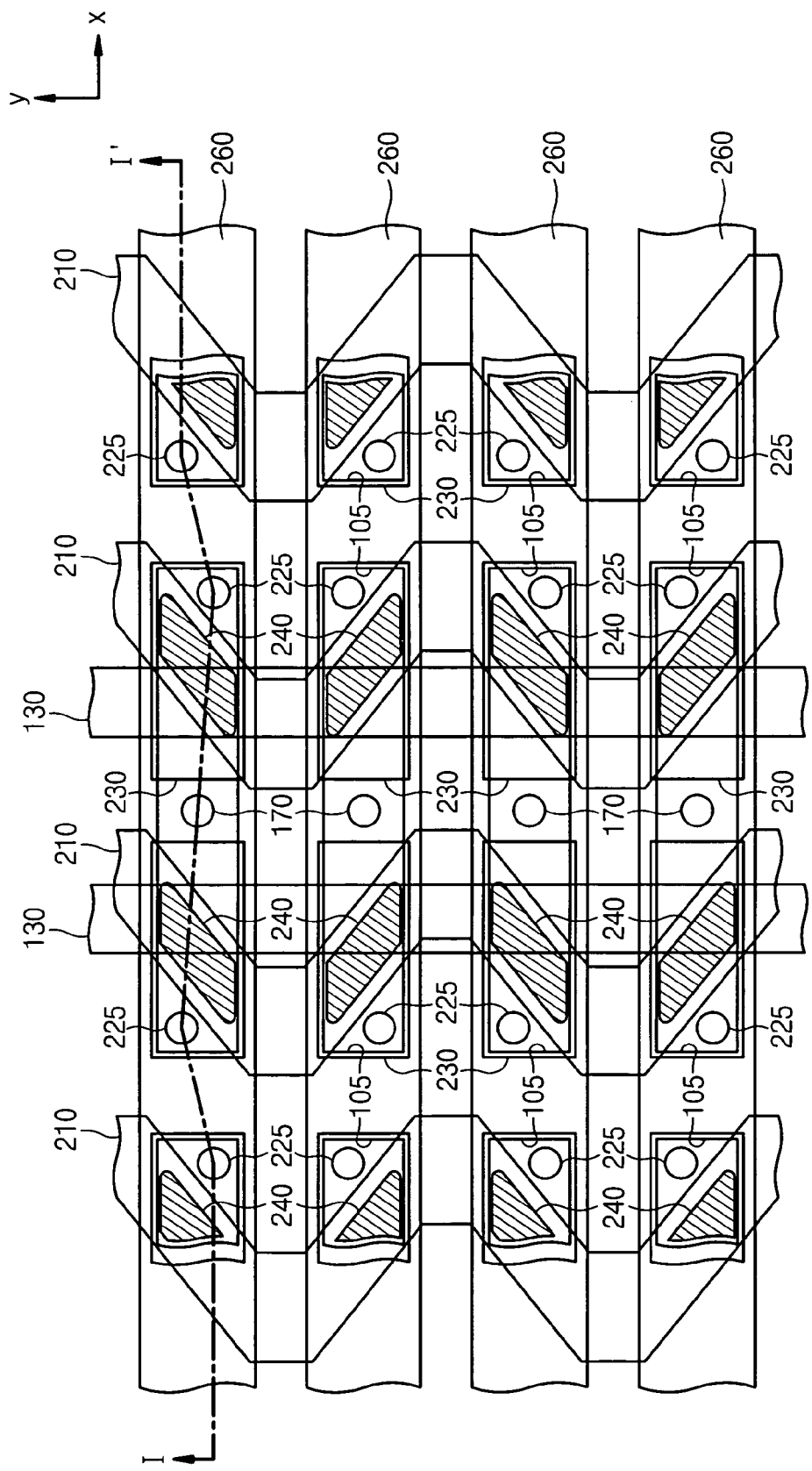
Figure 18:
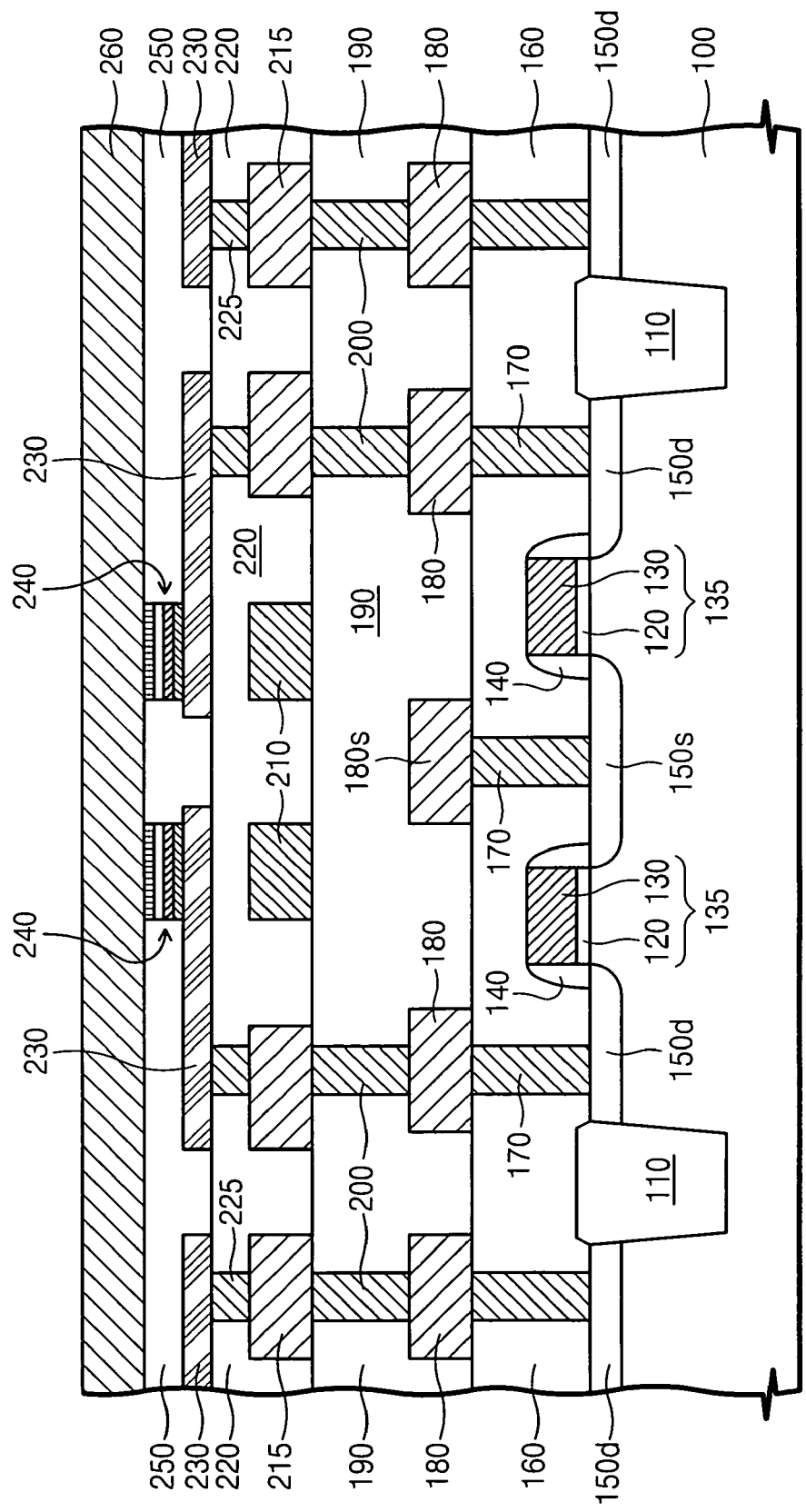

FIGS. 8A–B are plan views of cell arrays of MRAMs according to first embodiments of the present invention. FIG. 18 is a sectional view, taken along lines I–I' of FIGS. 8A, 8B, 9A, 9B, 10A, 10B, 11A and 11B, of operations for fabricating cell arrays of MRAMs according to embodiments of the present invention.

Referring to FIGS. 5, 8A and 18, device isolation regions 110 are formed in the semiconductor substrate 100 to define active regions 105 that are arranged in a two dimensional array. Gate electrodes 130 (i.e., word lines) intersect the active regions 105 and the device isolation region 110. The gate electrodes 130 are parallel to each other in a column direction (Y-axis direction). The active regions 105 are each intersected by a pair of gate electrodes 130. Accordingly, each active region 105 is divided into three regions: a common source region 150s in the active region 105 between the pair of gate electrodes 130, and drain regions 150d in the active regions 105 on opposite sides of the common source region 150s. The cell transistors are formed at the intersection points of the gate electrodes 130 and the active regions 105, and are thereby arranged in two dimensions along the column (Y-axis) and row (X-axis) directions.

The resultant structure including the cell transistors is covered with a lower interlayer insulating film of a sequentially stacked structure of a first lower interlayer insulating film 160 and a second lower interlayer insulating film 190. Contact plugs 170 penetrate the first lower interlayer insulating film 160 to connect to the common source region 150s and the drain region 150d. A source line 180s is formed on the first lower interlayer insulating film 160 and connects to the contact plugs 170 that are connected to the common source region 150s. Each of the source line 180s may connect a plurality of common source regions 150s on a common side of the word line 130. Accordingly, the source line 180s is parallel to the word line 130. A first metallic pattern 180 is formed on the first lower interlayer insulating film 160 and connected with the drain region 150d through the contact plug 170. The first metallic pattern 180 and the source line 180s may have the same thickness and be the same type of material. The second lower interlayer insulating film 190 covers the resultant structure including the first metallic pattern 180 and the source line 180s. Via plugs 200 penetrate the second lower interlayer insulating film 190 to connect to an upper surface of the first metallic pattern 180.

The digit lines 210 intersect the word lines 130 at an oblique angle, such that they are neither parallel with, nor perpendicular to, the word lines 130. The digit lines 210 also intersect the active regions 105 and the device isolation region 110 on the second lower interlayer insulating film 190. As used herein, lines "intersect" by crossing paths, although they may not be directly connected to each other. For example, as shown in FIGS. 8A and 18, digital lines 210 intersect word lines 130 by crossing over the word lines 130. According to the first embodiment of the present invention, the digit lines 210 are arranged in a zigzag pattern parallel to each other to provide sufficient spatial distance between them. A second metallic pattern 215 may be formed on the underlying second lower interlayer insulating film 190 and spaced apart from the digit lines 210, and connected to drain region 150d through the via plug 200. The second metallic pattern 215 and the digit line 210 may have the same thickness and be the same type of material.

The resultant substrate including the digit lines 210 is covered with the upper interlayer insulating film. The upper interlayer insulating film may have a sequentially stacked structure of a first upper interlayer insulating film 220 and a second upper interlayer insulating film 250. A lower electrode 230 is formed on the first upper interlayer insulating film 220 and extending over the digit line 210. The lower electrode 230 is connected to the second metallic pattern 215 through a conductive pattern 225 that penetrates the first upper interlayer insulating film 220.

The resultant substrate including the lower electrode 230 is covered with the second upper interlayer insulating film 250. A plurality of bit lines 260 are formed on the second upper interlayer insulating film 250 and arranged to perpendicularly intersect the word line 130. Accordingly, each bit line 260 can intersect a plurality of the digit lines 210 at an oblique angle, which, according to some embodiments of the present invention, is in a range of from 15° to 75°.

Intersection regions of one bit line (BL) and the digit lines (DL) may be shaped in a parallelogram frame. For example, as shown in FIG. 8A, the intersection regions have a parallel translation symmetry, and each word line 130 repeatedly intersects a corresponding one of the digit lines 210. Accordingly, the intersection regions of the word line (WL) and the digit line (DL) may have repeated mirror symmetry, such as shown in FIG. 8A.

The MTJ 240 extends through the second upper interlayer insulating film 250 to connect the bit line 260 and the lower electrode 230. The MTJ 240 may have a stacked structure of a pinning layer 242, a fixed layer 244, an insulating layer 246 and a free layer 248. The pinning layer 242 may be formed from an anti-ferromagnetic material, such as one or more of the materials IrMn, PtMn, MnO, MnS, MnTe, $MnF_2$, $FeF_2$, $FeCl_2$, FeO, $CoCl_2$, CoO, $NiCl_2$, NiO, Cr, or the like. The fixed layer 244 and the free layer 248 may be formed from one or more ferromagnetic materials such as Fe, Co, Ni, Gd, Dy, MnAs, MnBi, MnSb, $CrO_2$, $MnOFe_2O_3$, $FeOFe_2O_3$, $NiOFe_2O_3$, $CuOFe_2O_3$, $MgOFe_2O_3Y_3Fe_5O_{12}$, or the like. The fixed layer 244 can have a three-layered structure with a Ruthenium (Ru) film interposed between the ferromagnetic materials. The insulating layer 246 may be an aluminum oxide.

As shown in FIG. 18, the MTJ 240 may have a rectangular shape with less width along a direction of the bit line 260. In some other embodiments of the present invention, the MTJ 240 may have a parallelogram shape, such as the slanted shape that is shown in FIG. 8B. In yet other embodiments of the present invention, the MTJ 240 may have rounded corner portions, such as shown in FIGS. 8A–B.

Figure 9A:
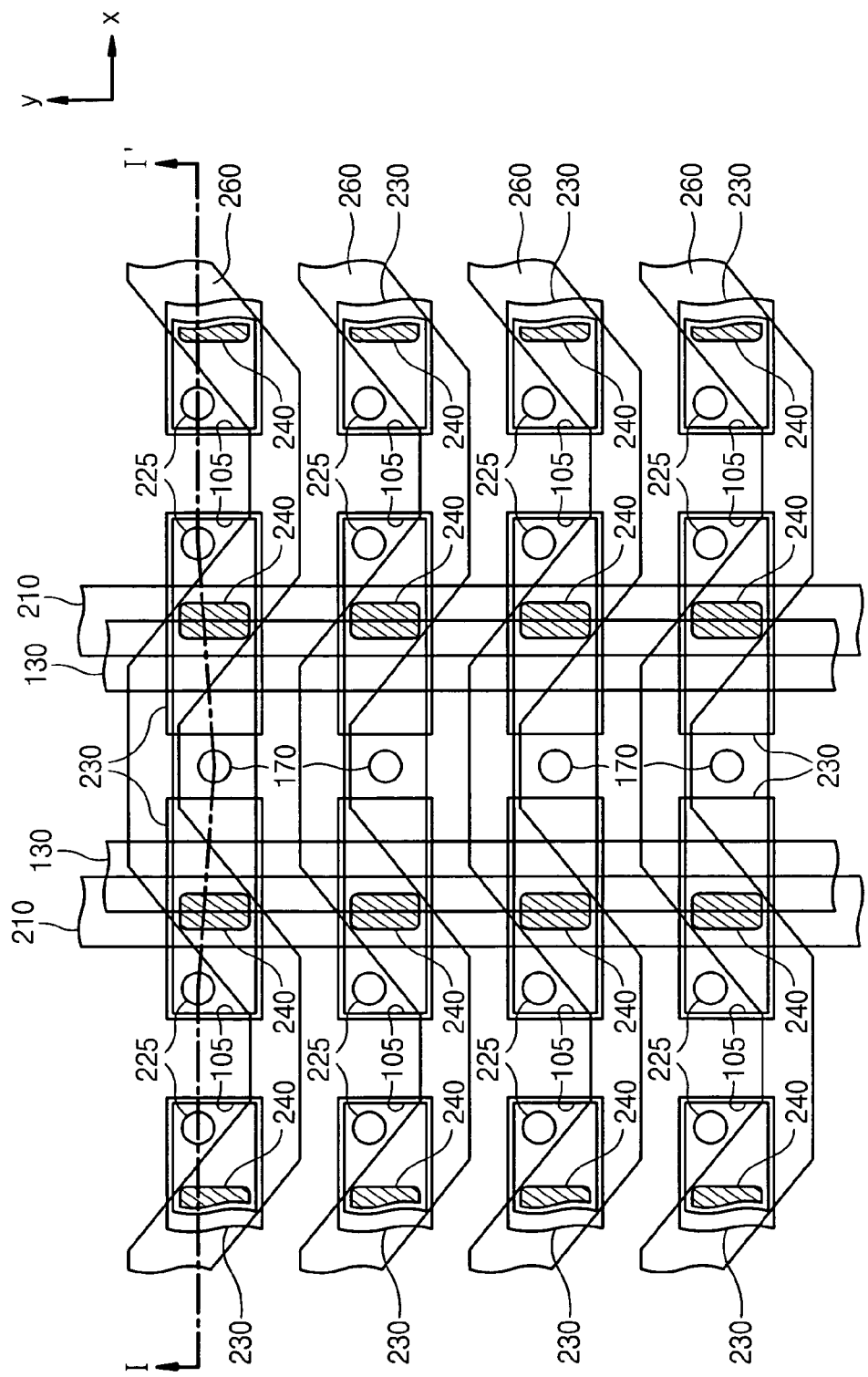

FIGS. 9A and 9B are plan views of cell arrays of MRAMs according to second embodiments of the present invention. The embodiments of the FIGS. 9A–B are described with reference to FIG. 5 in a similar manner as that provided for the first embodiment, and with duplicating descriptions being omitted. Referring to FIGS. 5, 9A, 9B and 18, a plurality of digit lines 210 are formed on the second lower interlayer insulating film 190 and intersect the active regions 105 and the device isolation region 110 in the vertical direction. The digit lines 210 are parallel to the word lines 130.

Bit lines 260 are on the second upper interlayer insulating film 250 and intersect the digit lines 210 at an oblique angle. The bit lines 260 zigzag and are parallel to each other to provide a known distance therebetween. The intersection regions of one bit line 260 and the digit lines 210 may have a parallelogram shape, and may have repeated mirror symmetry.

The MTJ 240 is between, and connected to, the bit lines 260 and the digit lines 210, such as described with regard to first embodiments of the present invention. The MTJ 240 may have a rectangular shape with less width in the direction of the bit line 260, and/or may have a parallelogram shape, such as that shown in FIG. 9B. The MTJ 240 may also have rounded corner portions, such as those shown in FIG. 9B.

Figure 6:
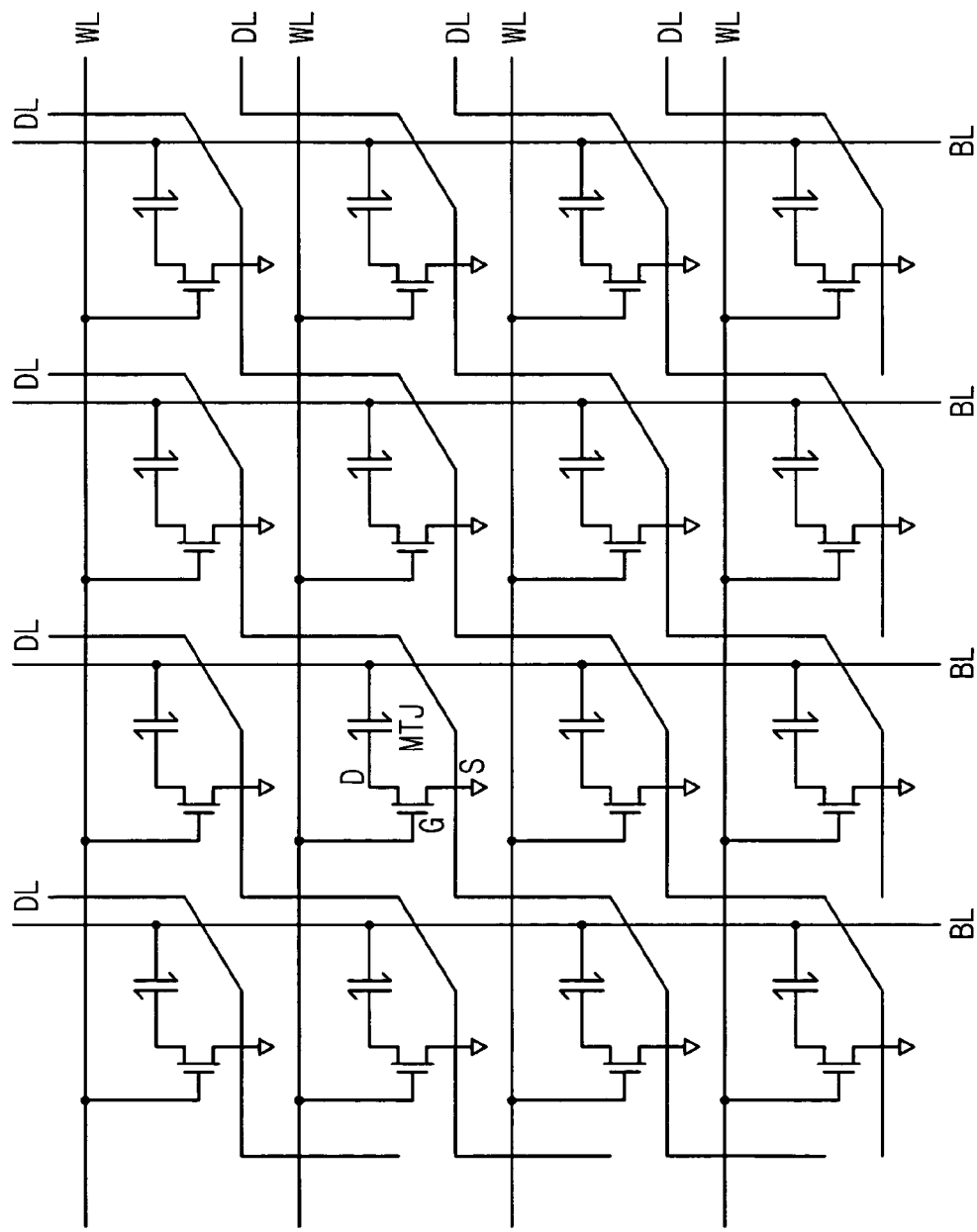
FIGS. 6 and 7 are each circuit diagrams of a cell array of an MRAM according to third and fourth embodiments of the present invention.
Figure 10A:
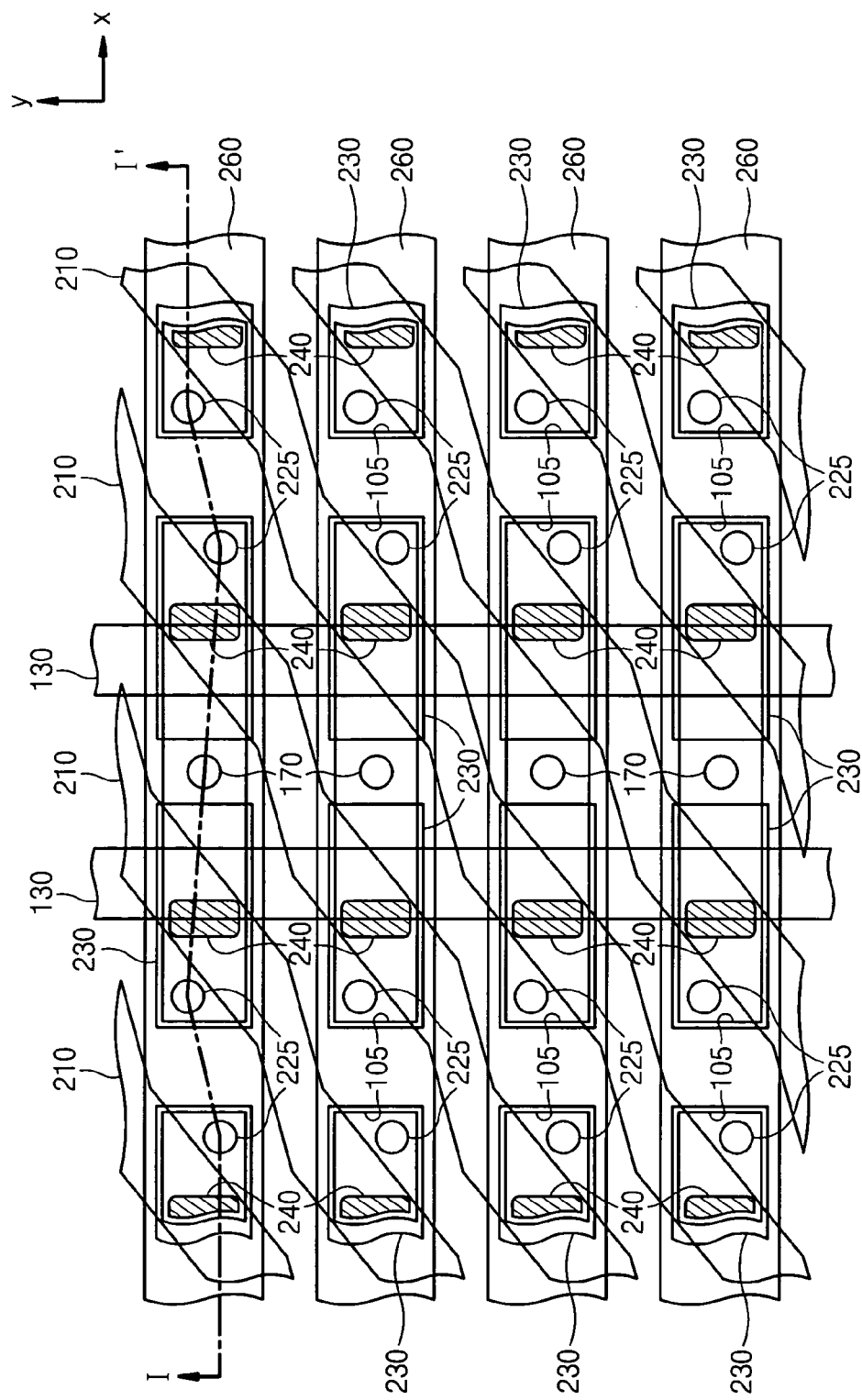
Figure 10B:
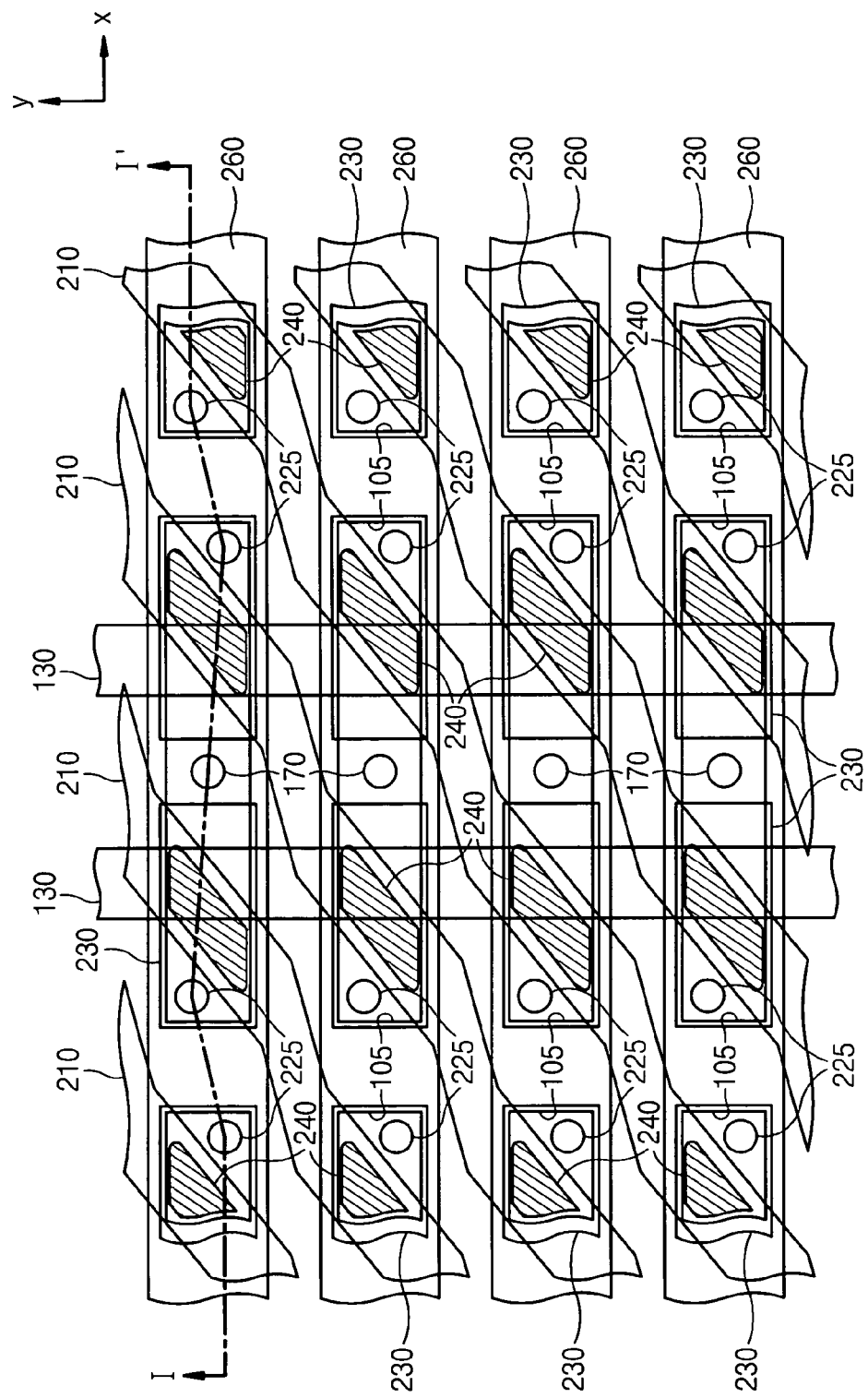

FIG. 6 is a circuit diagram of a portion of a cell array of a MRAM according to third embodiments of the present invention. FIGS. 10A and 10B are plan views of a portion of the cell array of the MRAM according to some related variations of the third embodiments of the present invention. The third embodiment and its related variations thereof are described with reference to FIGS. 6, 10A and 10B in a similar manner as that provided for the first embodiment of the present invention, with duplicating descriptions being omitted.

Referring to FIGS. 6, 10A, 10B and 18, the digit lines (DL) diagonally intersect over the cell transistors that are arrayed in two dimensions. Other structural elements including the word lines 130 and the bit lines 260 may be the same as those described for the first embodiment of the present invention. Accordingly, each digit line 210 may intersect the word lines 130 and the bit lines 260 at an oblique angle. Further, the intersection regions of bit lines 260 and the digit lines 210 may have a parallelogram shape, and may have parallel translation symmetry in the row and column direction.

In contrast, the word line 130 and the digit line 210 are not parallel to each other, so that, for example, the cell transistors that are selected by one word line 130 in a read mode are different from the cell transistors that are selected by one digit line 210 in a write mode. Generally, only one cell transistor is duplicately selected in both read and write modes.

The MTJ 240 may be arranged between the bit lines 260 and the digit lines 210 in the same manner as that described for the first embodiment of the present invention. The MTJ 240 may have rectangular shape with a less width in the direction of the bit line 260, and/or may have a parallelogram shape, such as that shown in FIG. 10B. The MTJ 240 may have rounded corner portions.

Figure 7:
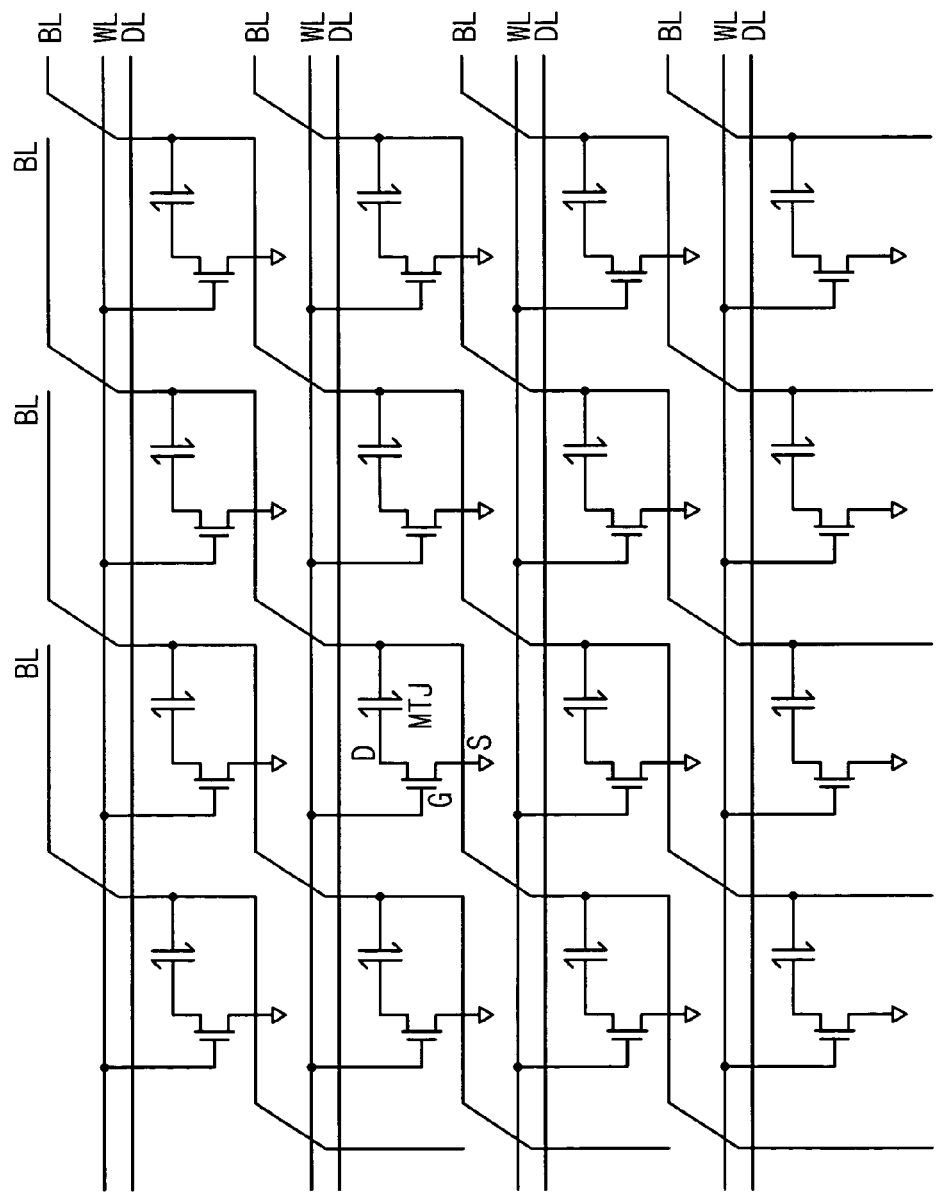
Figure 11A:
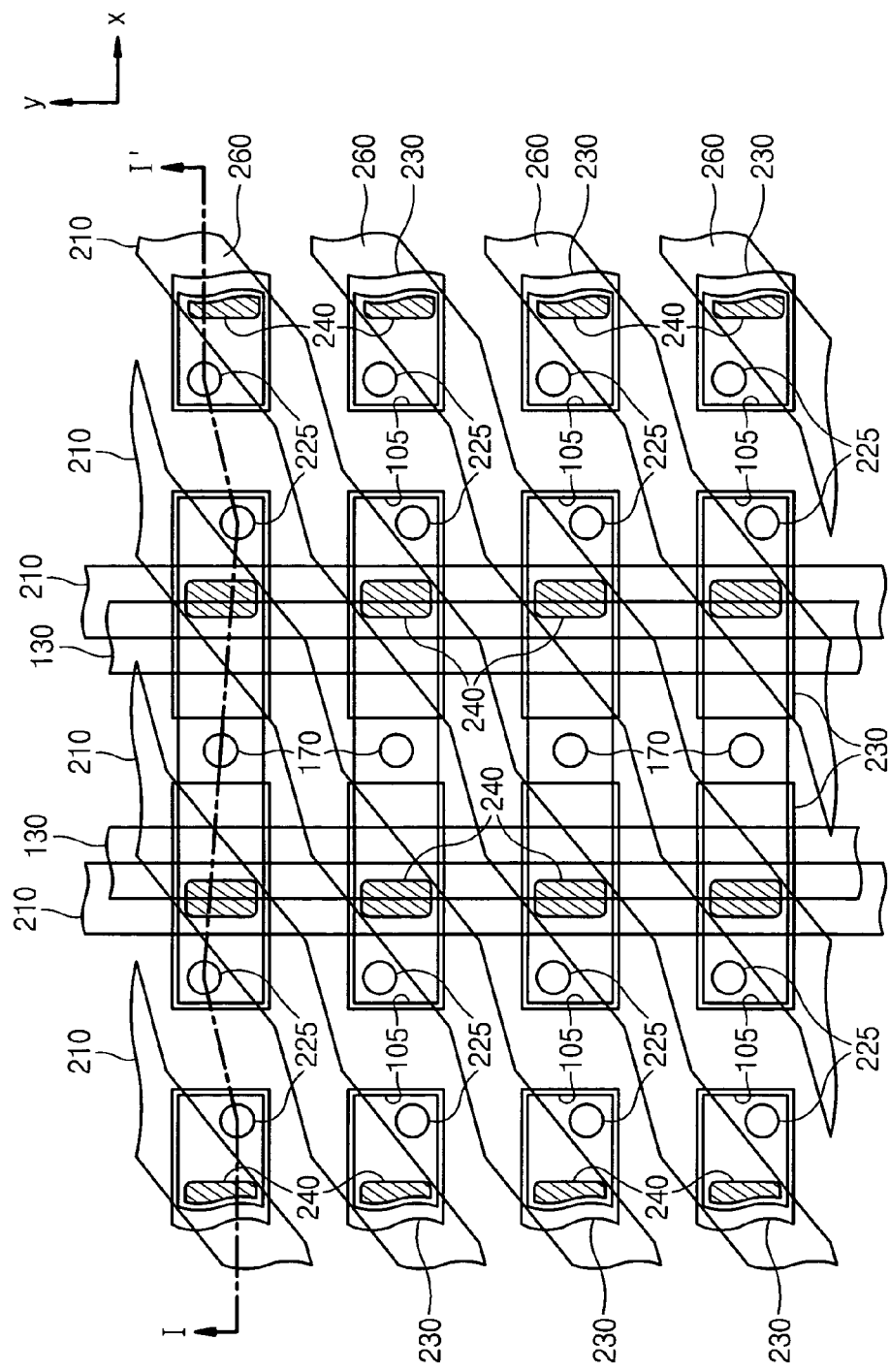
Figure 11B:
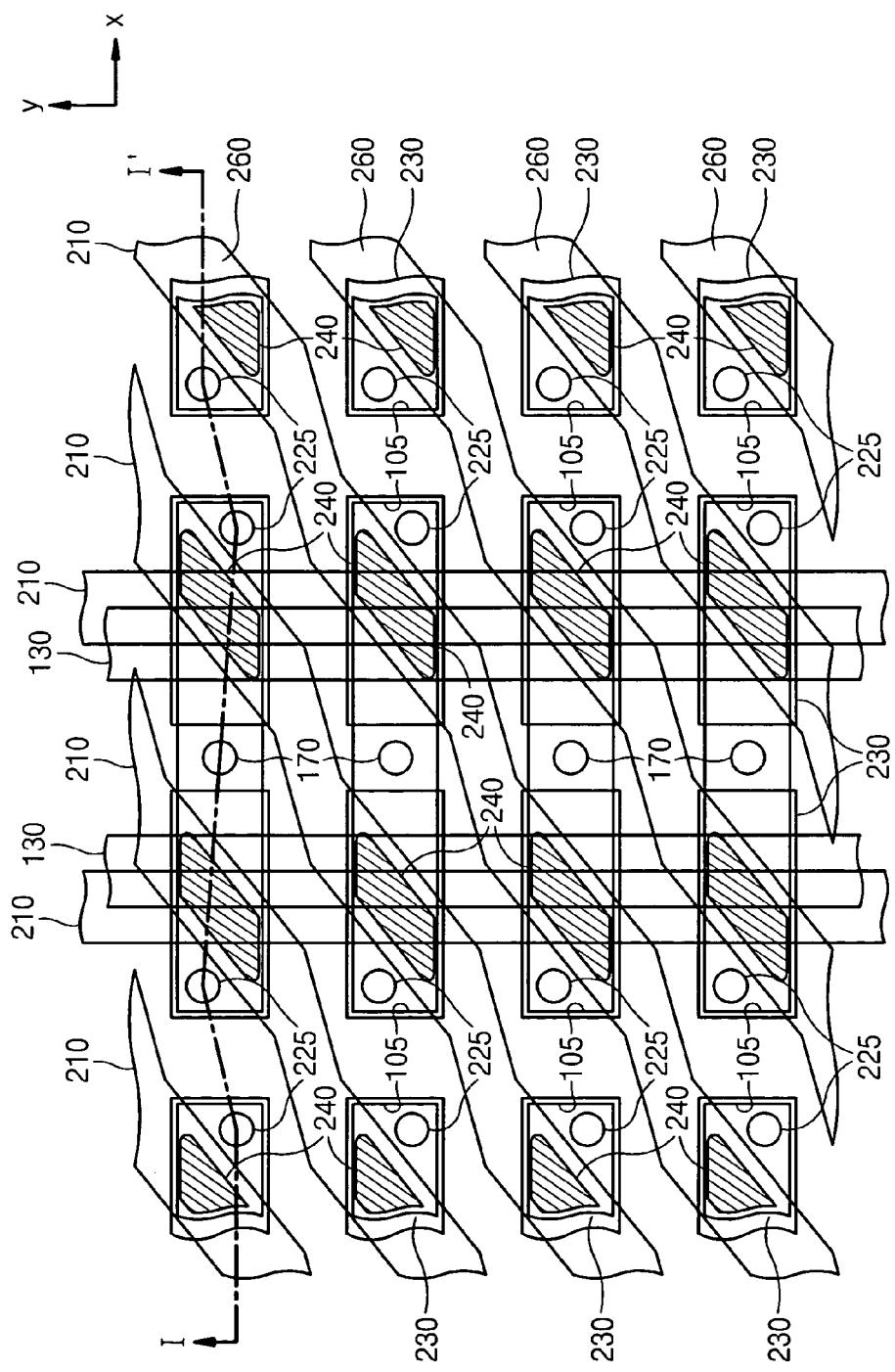

FIG. 7 is a circuit diagram of a portion of the cell array of the MRAM according to fourth embodiments of the present invention. FIGS. 11A and 11B are plan views of a portion of a cell array of a MRAM according to some related variations of the fourth embodiments of the present invention. The fourth embodiments and these related variations thereof are described with reference to FIGS. 7, 11A and 11B in the same manner as provided for the second embodiment of the present invention, with duplicating descriptions being omitted.

Referring to FIGS. 7, 11A, 11B and 18, the bit lines (BL) diagonally intersect over cell transistors that are arranged in two dimensional arrays. Other structural elements including the word lines 130 and the digit lines 210 may be the same as those described in the second embodiment of the present invention. Each bit line 260 intersects a plurality of the word lines 130 and the digit lines 210 at an oblique angle. The intersection regions may have a parallelogram shape, and may have a parallel translation symmetry in the row and column directions.

The MTJ 240 is arranged between, and connected to, the bit lines 260 and the digit lines 210, such as, for example, was described with regard to the second embodiments of the present invention. The MTJ 240 may have a rectangular shape with less width in the direction of the bit line 260, and/or may have a parallelogram shape, such as that shown in FIG. 11B. The MTJ 240 may have rounded corner portions.

FIG. 12 is a perspective view of the MRAM with the MTJ according to the first and third embodiments of the present invention. Referring to FIG. 12, the bit line 260 extends in the row direction (X-axis direction). The lower electrode 230 is under the bit line 260. The MTJ 240 is between the lower electrode 230 and the bit line 260. The MTJ 240 includes a stacked structure of the pinning film 242, the fixed layer 244, the insulating layer 246 and the free layer 248. The pinning layer 242 and the free layer 248 are respectively connected to the underlying lower electrode 230 and the overlying bit line 260. The digit line 210 is under the lower electrode 230 and intersects the bit line 260 at an oblique angle. The lower electrode 230 and the digit line 210 are spaced apart from each other. The lower electrode 230 is connected to the underlying conductive pattern 225 and the drain region 150d of the cell transistor. Accordingly, the digit line 210 is slanted (makes an oblique angle) with respect to the word line direction (Y-axis direction), and the bit line 260 is perpendicular to the word line direction.

FIG. 13 is a perspective view of the MRAM with the MTJ according to the second and fourth embodiments of the present invention. Referring to FIG. 13, the digit line 210 is arranged in the column direction (Y-axis direction). The lower electrode 230 is formed over the underlying digit line 210. The lower electrode 230 may extend in the vertical direction (X-axis direction) to the digit line 210. The lower electrode 230 and the underlying digit line 210 are spaced apart from each other. The lower electrode 230 is connected to the underlying conductive pattern 225 to form connections with the drain region 150d of the cell transistor. The bit line 260 is on the lower electrode 230 and intersects the digit line 210 at an oblique angle. The MTJ 240 is between the lower electrode 230 and the bit line 260. The MTJ 240 may be a stacked structure of the pinning film 242, the fixed layer 244, the insulating layer 246 and the free layer 248. The pinning layer 242 and the free layer 248 may be respectively connected to the underlying lower electrode 230 and the overlying bit line 260. Accordingly, the digit line 210 may be parallel with respect to the word line direction (Y-axis direction), and the bit line 260 may slanted with respect to the word line 130 and the digit line 210.

Figure 14:
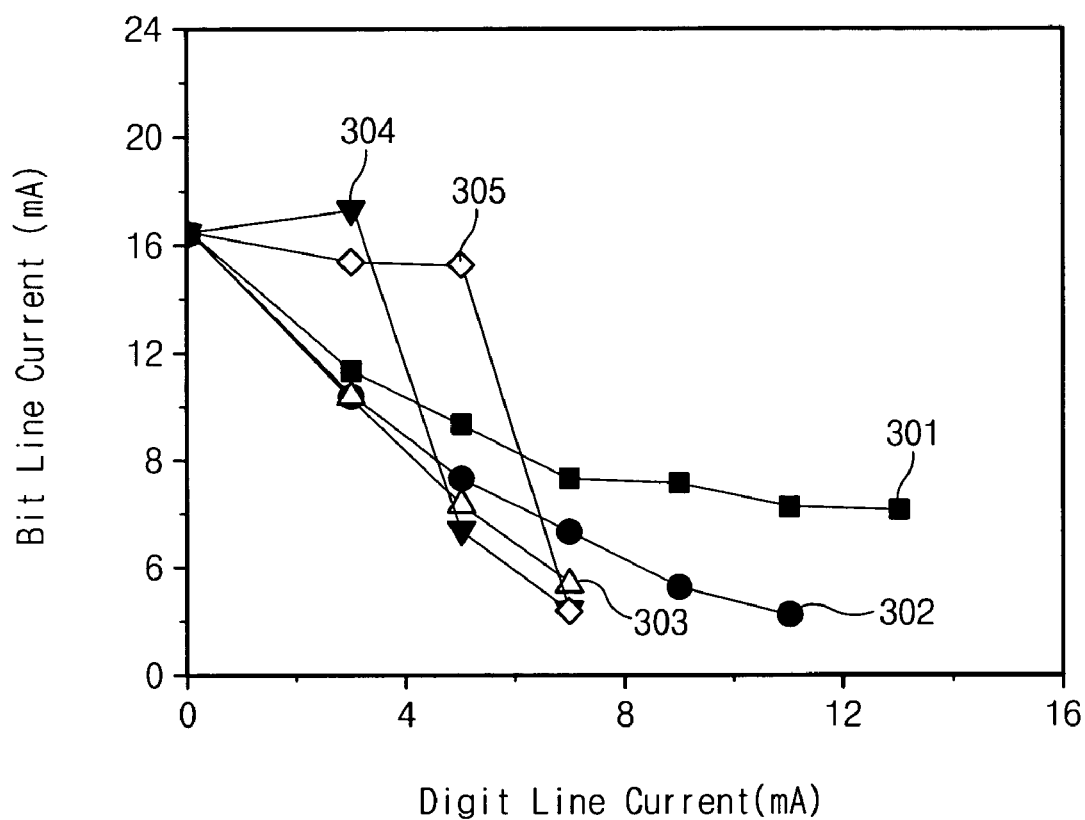
FIG. 14 is a graph of simulation results that illustrate an effect of having a bit line that intersects a digit line at an oblique angle according to embodiments of the present invention.

FIG. 14 is a graph of simulation results that illustrate an effect of having a bit line that intersects a digit line at an oblique angle. Referring to FIG. 14 shows results for current flowing through the bit line 260 and the digit line 210 that is sufficient to store information in the cell, and with the angle of intersection between the bit line 260 and the digit line 210 varying between 90° (301), 75° (302), 60° (303), 45° (304), and 30° ( For example, when the current in the digit line 210 is 7 mA, the current in the bit line 260 is 8 mA when the angle of intersection is 90°, and is 4 mA when the angle of intersection is 60°.

As illustrated by these results, the magnitude of the magnetic field that may be used to vary the magnetization direction of the free layer 248 is determined by a scalar product of the magnetic field that is generated by the current flowing through the digit line 210 and the bit line 260. In other words, because the value of cosθ increases as the angle of θ decreases from 90° to 0°, the angle of intersection between the digit line 210 and the bit line 260 may be decreased so as to increase the magnitude of the resultant magnetic field. Accordingly, the angle of intersection between the digit line 210 and the bit line 260 may be decreased to store information in a cell using less current. For example as shown in FIG. 14, the cell may be programmed using less current in the bit line 260 and the digit line 210 by intersecting the bit line 260 and the digit line 210 with a decreasing oblique angle. Accordingly, the power consumed in a write mode may be reduced, and a MTJ connected to each line may be subjected to less electromagnetic disturbance.

FIGS. 15 to 18 are sectional views along line I–I' of FIG. 8A of operations for fabricating MRAMs with magnetic tunnel junctions according to various embodiments of the present invention. Fabricating operations according to other embodiments of the present invention will be described with reference to procedural plan views shown in FIGS. 8B, 9A, 9B, 10A, 10B, 11A and 11B.

Figure 15:
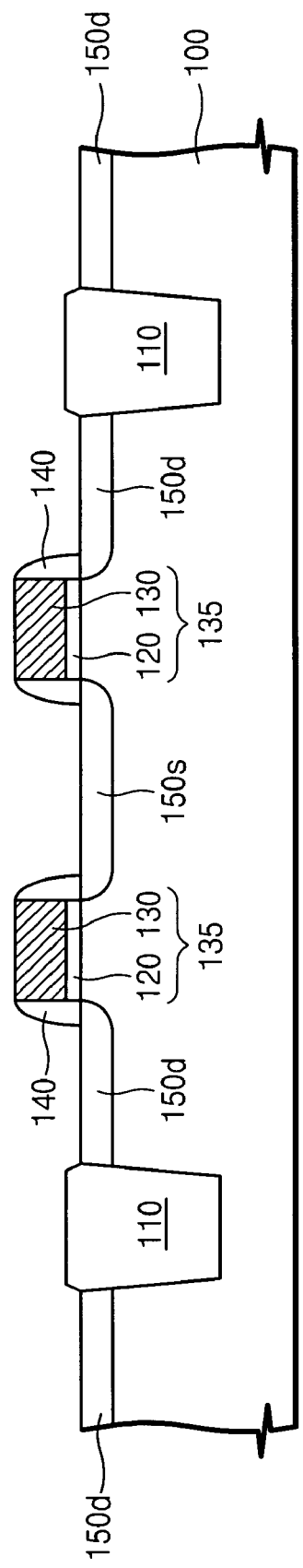
FIGS. 15 to 18 are sectional views of steps for fabricating MRAMs with magnetic tunnel junctions according to various embodiments of the present invention.

Referring to FIG. 15, the device isolation region 110 is formed in the semiconductor substrate 100 to define the plurality of active regions 105. The gate insulating film and the gate conductive film are sequentially formed on the surface of the resultant substrate 100 including the active regions 105. The gate conductive film and the underlying gate insulating film are sequentially patterned to form a plurality of gate patterns 135 that are parallel to one another. The plurality of gate patterns 135 intersects the device isolation region 110 and the active regions 105. The gate patterns 135 each include the sequentially stacked structure of the gate insulating pattern 120 and the gate electrode 130. The active regions 105 each intersect the pair of gate electrodes 130. The gate patterns 135 may also include a capping pattern formed on the underlying gate electrode 130, such as a word line.

The gate pattern 135 and the device isolation region 110 are used as implanting masks in order to implant into the active regions 105. As a result thereof, three impurity regions are formed in the active region 105. As shown, a middle-positioned impurity region among three impurity regions indicates the common source region 150s, and other impurity regions indicate the drain regions 150d.

Accordingly, the pair of cell transistors is respectively formed in one active region 105. As a result, the cell transistors are arrayed in two dimensions along the row and the column directions in the semiconductor substrate. Next, a spacer 140 is formed on sidewalls of the gate pattern 135 using the general manner.

Figure 16:
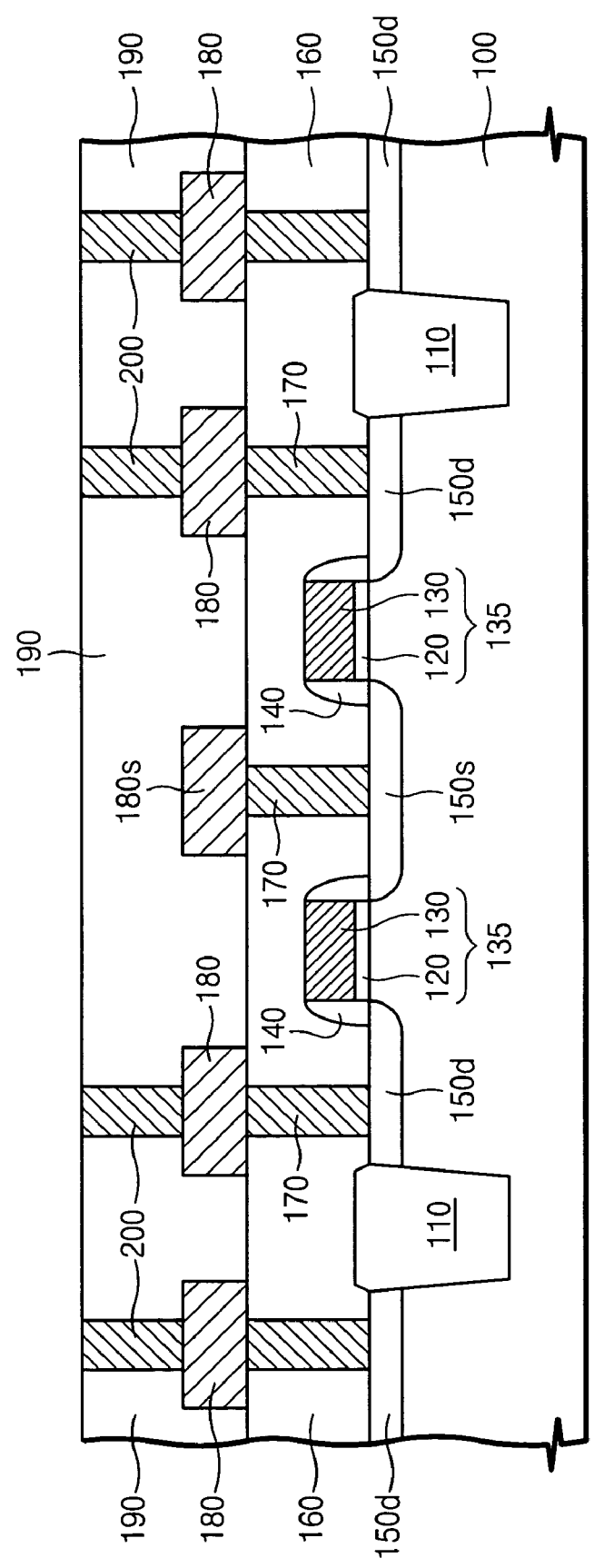

Referring to FIG. 16, the first lower interlayer insulating film 160 is formed on the whole surface of the resultant substrate including the spacer 140. The first lower interlayer insulating film 160 is patterned to form the contact hole exposing the source/drain regions 150s and 150d. The contact plugs 170 are formed to fill the contact hole using the general manner, thereby connecting to the source/drain regions 150s and 150d. A first metallic film is formed on the whole surface of the resultant substrate including the contact plugs 170. The first metallic film is patterned to form the source line 180s and the first metallic patterns 180 covering the underlying contact plugs 170. The source line 180s is connected to the underlying common source regions 150s through the contact plugs 170. Preferably, the common source regions 150s are formed in the active region 105 between the pair of the gate patterns 135, thereby connecting to one another through the source line 180s in the column direction. The first metallic patterns 180 with a width greater than the contact plugs 170 are spaced apart from the source line 180s.

A second lower interlayer insulating film 190 is formed on the whole surface of the resultant substrate including the source line 180s and the first metallic patterns 180. At this time, the first and the second interlayer insulating films 160 and 190 form an interlayer insulating film. The second lower interlayer insulating film 190 is patterned to form a first via hole exposing an upper surface of the first metallic pattern 180. Also, the first via hole exposes the upper surface of the source line 180s in a predetermined region. The plurality of via plugs 200 is formed to fill the first via hole.

Figure 17:
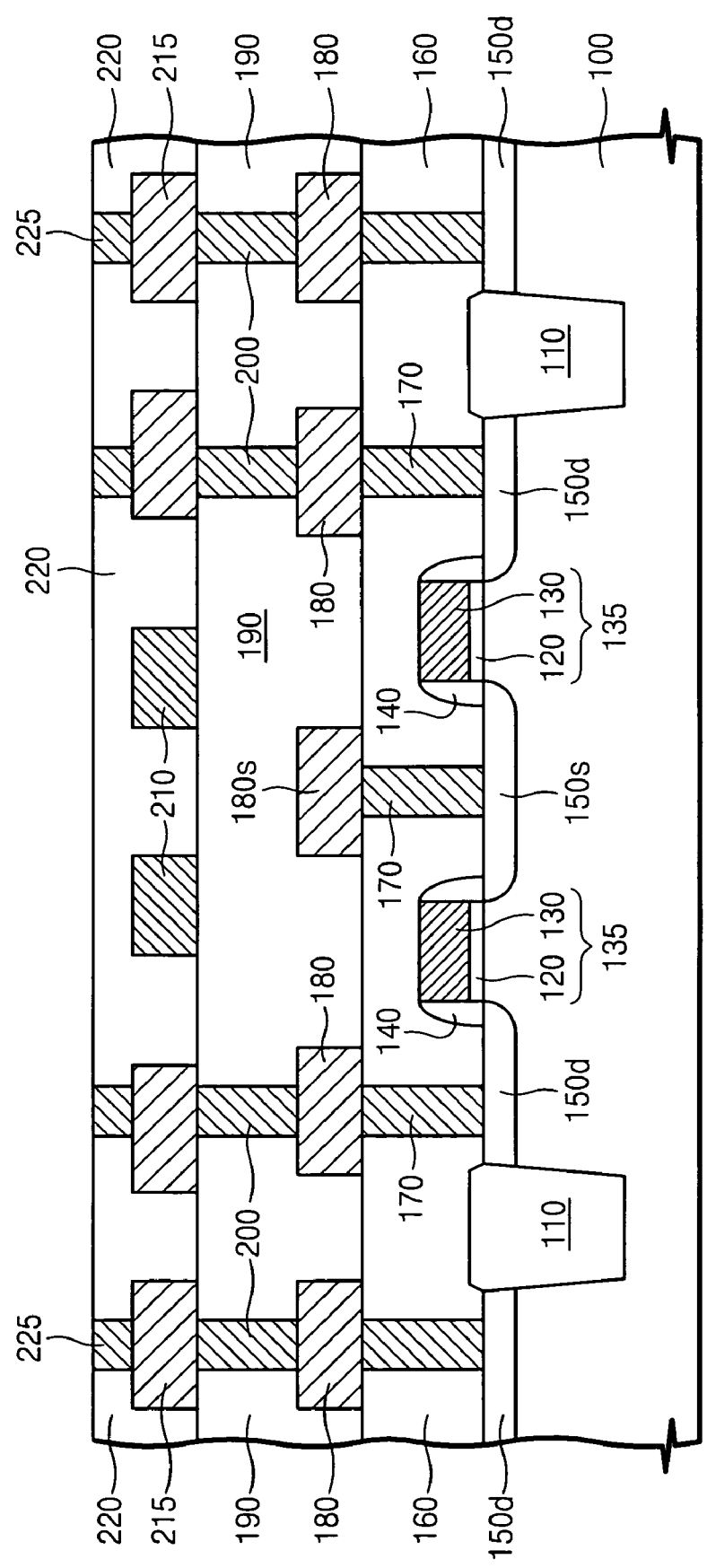

Referring to FIG. 17, a second metallic film is formed on the whole surface of the resultant substrate including the via plugs 200. The second metallic film is patterned to form the plurality of second metallic patterns 215 and the digit lines 210. The second metallic pattern 215 is formed to cover the upper surface of the via plugs 200. The digit line 210 is formed to intersect the active regions 105 and the device isolation region 110, and to intersect the word line 130 at an oblique angle, such as between about 15° to 75°. The digit lines 210 are preferably shaped in the zigzag in order to prevent an undesirable electrical short between the digit lines 210.

The digit lines 210 can be shaped to be in a linear frame parallel to the word line 130, as shown in FIGS. 9A, 9B, 11A and 11B. Also, the digit lines 210 can be formed to diagonally intersect the upper surface of the cell transistors arrayed in two dimensions, as shown in FIGS. 10A and 10B.

The first upper interlayer insulating film 220 is formed on the whole surface of the resultant substrate including the second metallic patterns 215 and the digit lines 210. Forming the first upper interlayer insulating film 220 can additionally include the step of regularizing a thickness of the first upper interlayer insulating film 220 remaining on the digit line 210, for example, a planarization step.

The first upper interlayer insulating film 220 is patterned to form a second via hole exposing the upper surface of the second metallic pattern 215. After that, the second via hole is filled to form the metallic patterns 225 connected to the drain region 150d.

On the other hand, the second metallic film is formed to fill the via hole, so that the via plugs 200 can be formed at the same time of forming the second metallic pattern 215 and the digit line 210.

Referring to FIG. 18, the MTJ 240 and the underlying lower electrode 230 are formed to connect to the conductive pattern 225, on the first upper interlayer insulating film 220. The lower electrode 230 is formed to connect to the upper surface of the conductive pattern 225 and to pass over the digit line 210. The digit line 210 and the lower electrode 230 are spaced apart from each other as much as a predetermined height, preferably a height of the conductive pattern 225. The conductive pattern 225 can be formed at the same time of forming the lower electrode 230 filling the second via hole.

The MTJ 240 includes a sequentially stacked structure of the pinning layer 242, the fixed layer 244, the insulating layer 246 and the free layer 248. The pinning layer 242 may be formed of at least one of the anti-ferromagnetic materials, including IrMn, PtMn, MnO, MnS, MnTe, $MnF_2$, $FeF_2$, $FeCl_2$, FeO, $CoCl_2$, CoO, $NiCl_2$, NiO, Cr, etc. The fixed layer 244 and the free layer 248 may each be formed of at least one of the ferromagnetic materials, including Fe, Co, Ni, Gd, Dy, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$, etc. The fi can be formed to have a three-layered structure in which a Ruthenium film (Ru) is interposed between the upper fixed layer and the lower fixed layer formed of ferromagnetic materials. The insulating layer 246 may be formed of aluminum oxide, with a regular thickness. In order to achieve this, the insulating layer 246 can be formed using a Chemical Vapor Deposition method (CVD) or an Atomic Layer Deposition method (ALD).

A sequence of forming the MTJ 240 and the lower electrode 230 can be changed. Also, the MTJ 240 may be shaped to be in the rectangular frame as shown in FIGS. 8A, 9A, 10A and 11A, and can be also shaped to be in the parallelogram frame as shown in FIGS. 8B, 9B, 10B and 11B. Since the MTJ 240 is formed through one time patterning process, the MTJ 240 can have the rounded corner portion.

A second upper interlayer insulating film 250 is formed on the whole surface of the resultant substrate including the lower electrode 230 and the MTJ 240. After that, the second upper interlayer insulating film 250 is planarized to expose the upper surface of the free layer 248. In order to reduce etching damage in the planarization process, an additional material film can be formed on the free layer 248.

The upper metallic film is formed on the whole surface of the resultant substrate including the exposed upper surface of the MTJ 240. The upper metallic film is patterned to form the plurality of bit lines 260 perpendicularly intersecting the word lines 130. The third embodiments and modifications thereof may also utilize an identical method for forming the bit lines 260 in the vertical direction to the word lines 130, as shown in FIGS. 10A and 10B. Also, the bit lines 260 can be formed to diagonally intersect over the cell transistors arrayed in two dimensions as shown in FIGS. 9A, 9B, 11A and 11B. According to the third embodiments, one bit line 260 connects the drain regions 150d to one another in the diagonal-arrayed cell transistors.

As described above, the bit line 260 and the digit line 210 intersect each other at an oblique angle, which may be in the range of about 15° to 75°, and the MTJ 240 is connected therebetween.

Accordingly, various embodiments of the present invention provide MRAMs and methods for fabricating MRAMs in which a bit line and a digit line intersect each other at an oblique angle, and which may thereby increase the magnitude of the magnetic field that results from current flowing through the bit line and the digit line. Power consumption may thereby be reduced in the write mode, and electromagnetic disturbance of a MTJ that is connected between the bit line and the digit line may be reduced.

It should be noted that many variations and modifications might be made to the embodiments described above without substantially departing from the principles of the present invention. All such variations and modifications are intended to be included herein within the scope of the present invention, as set forth in the following claims.

What is claimed is:

1. A magnetic memory comprising:
a plurality of digit lines;
a plurality of bit lines; and
a plurality of magnetic tunnel junctions (MTJs) arranged in rows and columns at overlap points between the bit lines and the digit lines,
wherein each of bit lines is coupled to MTJs in a respective column and each of the digit lines is coupled to MTJs in a respective row, and
wherein the digit lines and the bit lines intersect each other at an oblique angle, and the digit lines and/or the bit lines each have a zigzag shape that reverses direction with respect to itself.

2. The magnetic memory of claim 1, wherein the digit lines and the bit lines intersect each other at an oblique angle of between 15° to 75°.

3. The magnetic memory of claim 1, wherein the MTJs are directly connected to the bit lines, and are spaced apart from the digit lines.

4. The magnetic memory of claim 1, further comprising a plurality of cell transistors arranged along the rows and columns, wherein the cell transistors each comprise a gate electrode, a source region and a drain region, and wherein the gate electrodes of the cell transistors in a respective row are connected to form a word line, and wherein the drain region is electrically connected to a respective MTJ.

5. The magnetic memory of claim 4, wherein the digit lines are parallel to the word lines, and each of the bit lines has a zigzag shape that reverses direction with respect to itself and is electrically connected to the MTJs arranged along a diagonal direction with respect to the rows and columns.

6. The magnetic memory of claim 5, wherein the MTJs each have a parallelogram shape with two angles greater than approximately 90° and two angles less than approximately 90°.

7. The magnetic memory of claim 6, wherein two longer opposing sides of the parallelogram shaped MTJs are parallel to the bit lines.

8. The magnetic memory of claim 4, wherein the bit lines intersect the word lines, and each of the digit lines has a zigzag shape that reverses direction with respect to itself and is coupled to the MTJs arranged along a diagonal direction with respect to the rows and columns.

9. The magnetic memory of claim 8, wherein the MTJs each have a parallelogram shape with two angles greater than approximately 90° and two angles less than approximately 90°.

10. The magnetic memory of claim 9, wherein the two longer opposing sides of the parallelogram shaped MTJs are parallel to the digit lines.

11. The magnetic memory of claim 4 wherein the digit lines are parallel to the word lines, and each of the bit lines has a zigzag shape that reverses direction with respect to itself and overlaps the MTJs arranged along a diagonal direction with respect to the rows and columns.

12. The magnetic memory of claim 4, wherein the bit lines intersect the word lines, and each of the digit lines has a zigzag shape that reverses direction with respect to itself and overlaps the MTJs arranged along a diagonal direction with respect to the rows and columns.

13. The magnetic memory of claim 4, wherein the bit lines intersect the word lines, and each of the digit lines has a zigzag shape that reverses direction with respect to itself and intersects a respective word line in a zigzag pattern.

14. The magnetic memory of claim 1, wherein the plurality of MTJs coupled by the bit lines and digit lines are arranged in a rectangular shape.

15. The magnetic memory of claim 1, wherein the digit lines and the bit lines intersect each other at an oblique angle of between 60° and 90°.

16. The magnetic memory of claim 1, wherein the digit lines and/or the bit lines have a repeating "W" shape.

17. The magnetic memory of claim 1, wherein the digit lines and/or the bit lines have a repeating "V" shape.

* * * * *